United States Patent
Takata

(10) Patent No.: US 11,508,907 B2
(45) Date of Patent: Nov. 22, 2022

(54) FUNCTIONAL LAYER FORMING INK AND SELF-LUMINOUS ELEMENT MANUFACTURING METHOD

(71) Applicant: JOLED Inc., Tokyo (JP)

(72) Inventor: Masakazu Takata, Tokyo (JP)

(73) Assignee: JOLED INC., Tokyo (JP)

( * ) Notice: Subject to any disclaimer, the term of this patent is extended or adjusted under 35 U.S.C. 154(b) by 157 days.

(21) Appl. No.: 17/121,779

(22) Filed: Dec. 15, 2020

(65) Prior Publication Data
US 2021/0184120 A1 Jun. 17, 2021

(30) Foreign Application Priority Data
Dec. 17, 2019 (JP) .............................. JP2019-227394

(51) Int. Cl.
| | | |
|---|---|---|
| H01L 51/00 | (2006.01) | |
| H01L 51/56 | (2006.01) | |
| H01L 27/32 | (2006.01) | |
| H01L 51/50 | (2006.01) | |

(52) U.S. Cl.
CPC ...... H01L 51/0007 (2013.01); H01L 27/3211 (2013.01); H01L 51/0004 (2013.01); H01L 51/56 (2013.01); H01L 51/5012 (2013.01); H01L 51/5056 (2013.01); H01L 51/5072 (2013.01); H01L 51/5088 (2013.01); H01L 51/5092 (2013.01)

(58) Field of Classification Search
CPC .............. H01L 51/0003–0005; H01L 51/0007
See application file for complete search history.

(56) References Cited

U.S. PATENT DOCUMENTS

| | | | |
|---|---|---|---|
| 2001/0003602 A1* | 6/2001 | Fujita | ................. H01L 51/0038 427/64 |
| 2009/0239045 A1* | 9/2009 | Kato | ................... C09D 179/02 427/256 |
| 2010/0213438 A1 | 8/2010 | Cho et al. | |
| 2013/0256636 A1 | 10/2013 | Watanabe | |
| 2015/0270485 A1* | 9/2015 | Watanabe | ............. C09D 11/52 438/22 |
| 2017/0137651 A1 | 5/2017 | Watanabe | |

FOREIGN PATENT DOCUMENTS

| | | |
|---|---|---|
| JP | 2009-300909 A | 12/2009 |
| JP | 2010-199067 A | 9/2010 |
| JP | 2012-109286 A | 6/2012 |
| JP | 2013-527980 A | 7/2013 |
| JP | 2013-214397 A | 10/2013 |
| JP | 2015-029020 A | 2/2015 |
| JP | 2017-088780 A | 5/2017 |
| JP | 2017-098490 A | 6/2017 |
| WO | 2011/128034 A1 | 10/2011 |

* cited by examiner

Primary Examiner — Daniel P Shook
(74) Attorney, Agent, or Firm — Xsensus LLP

(57) ABSTRACT

An ink used in forming a functional layer of a self-luminous element by a printing method, the ink including a functional material and a mixed solvent. The mixed solvent includes solvents each having different vapor pressures. The functional material is dissolved or dispersed in the mixed solvent. A solvent that has a lowest vapor pressure among the solvents has a viscosity of at least 53 mPa·s, and a viscosity of the mixed solvent is 15 mPa·s or less.

7 Claims, 19 Drawing Sheets

| | Constituent solvent | | | | |
|---|---|---|---|---|---|
| | (I) Tetraethylene Glycol Dimethyl Ether | (II) 1,5-Pentanediol | (III) Hexylene Glycol | (IV) benzyl alcohol | (V) 2-Butoxyethanol |
| Vapor pressure (Pa) | 0.1 | 1 | 8 | 15 | 100 |
| Viscosity (mPa·s) | 4 | 135 | 38 | 6 | 3 |
| Mixed solvent example 1 | | 24 | | 30 | 46 |
| Mixed solvent example 2 | | 21 | | 30 | 49 |
| Mixed solvent example 3 | | 18 | | 30 | 52 |
| Mixed solvent example 4 | | 15 | | 30 | 55 |
| Mixed solvent example 5 | | 12 | | 30 | 58 |
| Reference example 1 | | | 20 | 30 | 50 |
| Reference example 2 | 5 | 15 | | 30 | 50 |

FIG. 1

| | (I) Tetraethylene Glycol Dimethyl Ether | (II) 1,5-Pentanediol | Constituent solvent (III) Hexylene Glycol | (IV) benzyl alcohol | (V) 2-Butoxyethanol |
|---|---|---|---|---|---|
| Vapor pressure (Pa) | 0.1 | 1 | 8 | 15 | 100 |
| Viscosity (mPa·s) | 4 | 135 | 38 | 6 | 3 |
| Mixed solvent example 1 | | 24 | | 30 | 46 |
| Mixed solvent example 2 | | 21 | | 30 | 49 |
| Mixed solvent example 3 | | 18 | | 30 | 52 |
| Mixed solvent example 4 | | 15 | | 30 | 55 |
| Mixed solvent example 5 | | 12 | | 30 | 58 |
| Reference example 1 | | | 20 | 30 | 50 |
| Reference example 2 | 5 | 15 | | 30 | 50 |

FIG. 5A

Two-component mixed solvent

| | Evaporation proportion | Ratio of solvent 1 (vapor pressure p1, viscosity $\eta 1$) | Ratio of solvent 2 (vapor pressure p2, viscosity $\eta 2$) | Composite viscosity |
|---|---|---|---|---|
| Initial | 0 | $x_0$ | $y_0$ | $\eta_1^{a1} \times \eta_2^{a2}$ <br> (a1= $\frac{x_0}{x_0+y_0}$) <br> (a2= $\frac{y_0}{x_0+y_0}$) — Expression (1) |
| During drying | $\alpha$ | $x_1 = x_0 - \frac{p_1}{(p_1+p_2)} \alpha$ (RHS>0) <br> $=0$ (RHS≤0) <br> ...Expression (2) | $y_1 = y_0 - \frac{p_2}{(p_1+p_2)} \alpha$ (RHS>0) <br> $=0$ (RHS≤0) <br> ...Expression (3) | $\eta_1^{b1} \times \eta_2^{b2}$ <br> (b1= $\frac{x_1}{x_1+y_1}$) <br> (b2= $\frac{y_1}{x_1+y_1}$) — Expression (4) |

FIG. 5B Three-component mixed solvent

| | Evaporation proportion | Ratio of solvent 1 (vapor pressure p1, viscosity $\eta 1$) | Ratio of solvent 2 (vapor pressure p2, viscosity $\eta 2$) | Ratio of solvent 3 (vapor pressure p3, viscosity $\eta 3$) | Composite viscosity |
|---|---|---|---|---|---|
| Initial | 0 | $x_0$ | $y_0$ | $z_0$ | $\eta_1^{c1} \times \eta_2^{c2} \times \eta_3^{c3}$ <br> (c1= $\frac{x_0}{x_0+y_0+z_0}$) <br> (c2= $\frac{y_0}{x_0+y_0+z_0}$) <br> (c3= $\frac{z_0}{x_0+y_0+z_0}$) — Expression (5) |
| During drying | $\alpha$ | $x_1 = x_0 - \frac{p_1}{(p_1+p_2+p_3)} \alpha$ (RHS>0) <br> $=0$ (RHS≤0) | $y_1 = y_0 - \frac{p_2}{(p_1+p_2+p_3)} \alpha$ (RHS>0) <br> $=0$ (RHS≤0) | $z_1 = z_0 - \frac{p_3}{(p_1+p_2+p_3)} \alpha$ (RHS>0) <br> $=0$ (RHS≤0) | $\eta_1^{d1} \times \eta_2^{d2} \times \eta_3^{d3}$ <br> (d1= $\frac{x_1}{x_1+y_1+z_1}$) <br> (d2= $\frac{y_1}{x_1+y_1+z_1}$) <br> (d3= $\frac{z_1}{x_1+y_1+z_1}$) — Expression (6) |

FIG. 10

<Other solvent examples>

| |
|---|
| 1,3-butylene glycol<br>Vapor pressure: 8 Pa  Viscosity: 95 mPa·s |
| 2,3-butanediol<br>Vapor pressure: 23 Pa  Viscosity: 104 mPa·s |
| Dipropylene glycol<br>Vapor pressure: 4 Pa  Viscosity: 116 mPa·s |
| Propylene glycol<br>Vapor pressure: 11 Pa  Viscosity: 56 mPa·s |
| Tetraethylene glycol<br>Vapor pressure: 1 Pa  Viscosity: 55 mPa·s |
| 1,3-propanediol<br>Vapor pressure: 5 Pa  Viscosity: 53 mPa·s |

FUNCTIONAL LAYER FORMING INK AND SELF-LUMINOUS ELEMENT MANUFACTURING METHOD

CROSS REFERENCE TO RELATED APPLICATION

This application claims priority to Japanese Patent Application No. 2019-227394 filed Dec. 17, 2019, the contents of which are hereby incorporated by reference in their entirety.

BACKGROUND OF THE DISCLOSURE

Technical Field

The present disclosure relates to inks used in forming functional layers when the functional layers in self-luminous elements such as organic electroluminescence (EL) elements are manufactured by a wet process, and methods of manufacturing self-luminous elements in which such inks are used.

Description of the Related Art

In recent years, organic EL display panels that utilize light emitting by organic EL elements have been actively developed. An organic EL element typically includes a pixel electrode (first electrode), where each pixel electrode in a display corresponds to a sub-pixel, functional layers including an organic light-emitting layer, and a counter electrode (second electrode), where the counter electrode in a display is common to multiple organic EL elements, stacked in this order above a substrate. Holes and electrons supplied from the pixel electrode and the counter electrode recombine in the organic light-emitting layer to emit light.

Conventionally, the organic light-emitting layers in an organic EL display panel are often formed by a dry process such as vacuum deposition, but with the progress of wet application technology, technology for forming organic light-emitting layers by printing methods (wet processes) is becoming widespread.

In such printing methods, a solution (also referred to as "ink") in which an organic light-emitting material is dissolved or dispersed in an organic solvent is applied to required locations by nozzles of a printing device, then dried to form organic light-emitting layers, and therefore even if a large organic EL display panel is manufactured, equipment cost can be suppressed and material utilization rates are high, which is beneficial in terms of manufacturing costs.

SUMMARY

A functional layer forming ink according to at least one embodiment is an ink used in forming a functional layer of a self-luminous element by a printing method, the ink including a functional material and a mixed solvent. The mixed solvent includes solvents each having different vapor pressures. The functional material is dissolved or dispersed in the mixed solvent. A solvent that has a lowest vapor pressure among the solvents has a viscosity of at least 53 mPa·s, and a viscosity of the mixed solvent is 15 mPa·s or less.

BRIEF DESCRIPTION OF THE DRAWINGS

Objects, advantages, and features of the technology pertaining to the present disclosure will become apparent from the following description thereof taken in conjunction with the accompanying drawings, which illustrate at least one embodiment of the technology pertaining to the present disclosure.

FIG. 1 is a table illustrating composition of mixed solvent examples according to the present disclosure and reference examples.

FIG. 5A illustrates expressions for determining composite viscosity of two-component mixed solvent, and FIG. 5B illustrates expressions for determining composite viscosity of three-component mixed solvent.

FIG. 10 is a list illustrating examples of other solvents capable of achieving effects of described by the present disclosure.

FIG. 18A, 18B, 18C, 16D are cross-section diagrams schematically illustrating a portion of the organic EL element manufacturing process continuing from FIG. 17B.

DETAILED DESCRIPTION

As a light-emitting layer film forming process for organic EL elements of an organic EL display panel, wet application film forming using a printing device or the like is superior to film formation methods such as vacuum deposition in terms of manufacturing cost.

However, in order to avoid mixing of inks including different organic light-emitting materials and to define sub-pixels, banks are provided on a substrate, ink is applied to application areas surrounded by the banks and dried in place. In this process, side portions of organic light-emitting layers in contact with side surfaces of the banks tend to end up higher than central portions, resulting in concave shapes, making it difficult to form an organic light-emitting layer within the banks that has uniform film thickness.

Thus, uniformity of light emission of light-emitting layers in pixels is impaired, which may cause a decrease in luminance efficiency, deterioration of image quality, and shortening of life of the organic EL display panel.

In particular, there has been a strong demand recently for higher definition display images, meaning that a width of a pixel has become narrower. However, there has not been much improvement in reducing the occurrence of "rising portions" along side surfaces of banks, and therefore with narrower sub-pixels, the ratio of the rising portions in a sub-pixel has increased, and uniformity of film thickness of light-emitting layers has further deteriorated.

The inventor of the present application has extensively researched to improve uniformity of film thickness of light-emitting layers formed by a printing method, and confirmed that convection occurs in ink from the time of application to the time of drying, and that convection is a major obstacle to uniformity of film thickness.

Figure 19A:
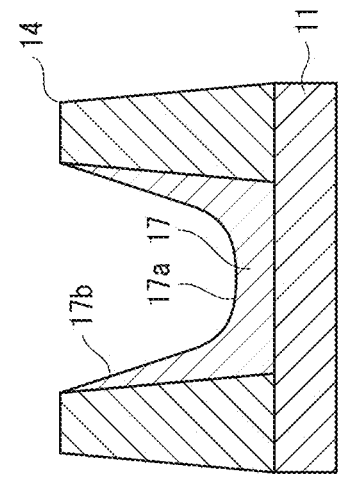
FIG. 19A, 19B, 19C are schematic cross-section diagrams for describing a process of forming an organic light-emitting layer by a printing method.
Figure 19B:
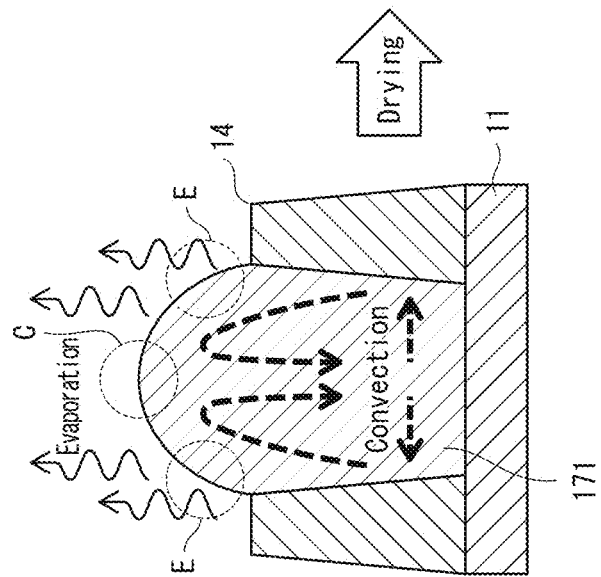
Figure 19C:
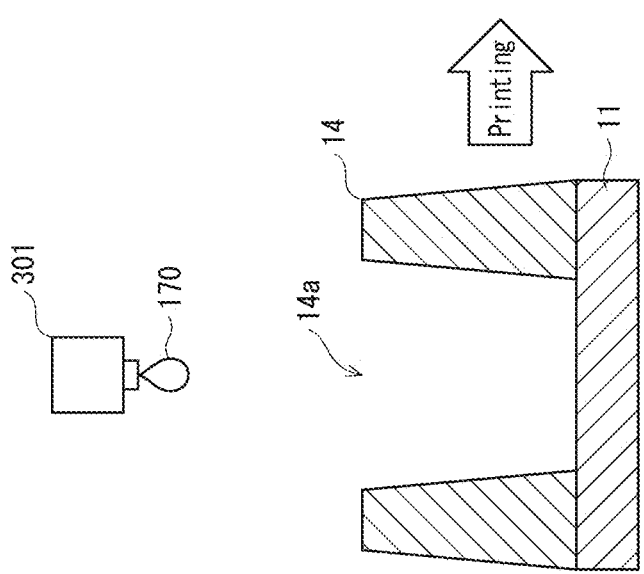

FIG. 19A, 19B, 19C are diagrams schematically illustrating a process of forming a light-emitting layer by a printing method, in which an interlayer insulating layer, pixel electrode, hole injection layer, and the like are not depicted.

As illustrated in FIG. 19A, when an ink 170 for forming an organic light-emitting layer is dropped from an application head 301 into an opening 14a on a substrate 11, an ink pool 171 is formed that bulges upwards from the opening 14a, as illustrated in FIG. 19B.

As described above, the ink 170 is formed by dissolving an organic light-emitting material in a volatile solvent (organic solvent), and the solvent gradually evaporates from a surface of the ink. The degree of evaporation is not uniform, and typically portions of a surface of the ink pool 171 near banks 14 (peripheral portions of the surface of the ink pool 171) evaporate faster than a central portion C, and it is known that this causes convection inside the ink pool 171.

That is, specific gravities of the organic light-emitting material and the solvent are not exactly the same, and specific gravity of the organic light-emitting material may be larger or smaller than specific gravity of the solvent depending on the combination. As described above, solvent evaporation rate varies depending on location, and therefore partial differences in specific gravity (density) of ink occur, and ink having a relatively large specific gravity tends to move downwards under the influence of gravity. Further, when there is a difference in ink density, a force is generated that diffuses particles to make the ink density uniform. Further, Rayleigh-Bénard convection caused by a difference in temperature distribution, the Marangoni convection caused by a difference of surface tension, and the like are also induced, and a result of a complex combination of these effects is ink convection as illustrated by the bold arrows in FIG. 19B.

As a result of such convection, ink moves along side surfaces of the banks 14 while being pressed against the side surfaces of the banks, and the evaporation rate of the solvent is faster at the periphery of the ink pool 171 (nearer the side surfaces of the banks 14), and therefore an amount of drying while adhering to the side surfaces of the banks 14 increases (rising portion 17b), and the light-emitting layer 17 is formed having a correspondingly large depression in a central portion 17a.

The ink convection indicated by the bold arrow in FIG. 19B is merely an example, and the combination of organic light-emitting material and solvent and other conditions may cause convection in a direction opposite that illustrated in FIG. 19B, but in any case, as long as convections occurs in applied ink, an amount of ink moving along side surfaces of the banks 14 increases, and a problem of non-uniformity occurs, as illustrated in FIG. 19C.

That is, when ink is applied to an application area surrounded by banks, solvent evaporates from the surface of the ink, but due to the differences in evaporation rate, ink density becomes non-uniform, convection occurs in the ink, and the convection exerts a force pressing the ink against side surfaces of the banks. If drying proceeds under these conditions, an amount of ink that rises along and adheres to the side surfaces of the banks increases, and an amount of ink in a central portion decreases correspondingly to form a convex shape, and therefore the film thickness of the organic light-emitting layer after drying becomes non-uniform.

Accordingly, suppressing ink convection due to differences in solvent evaporation rate is an important factor in improving uniformity of film thickness of light-emitting layers. In order to suppress such ink convection, increasing ink viscosity is effective, but an increase in ink viscosity increases the likelihood of nozzles of a printing device clogging, which causes inconvenience or defects in a printing process.

Such inconvenience or defects are not limited to the organic light-emitting layers, and can occur when other functional layers such as hole injection layers, hole transport layers, an electron injection layer, an electron transport layer, and the like are formed by a printing method.

As a result of extensive research into an ink capable of forming a functional layer having a high flatness while also eliminating trouble such as nozzle clogging of a printing device, the inventor arrived at the embodiments of the present disclosure.

A functional layer forming ink according to at least one embodiment is an ink used in forming a functional layer of a self-luminous element by a printing method, the ink including a functional material and a mixed solvent. The mixed solvent includes solvents each having different vapor pressures. The functional material is dissolved or dispersed in the mixed solvent. A solvent that has a lowest vapor pressure among the solvents has a viscosity of at least 53 mPa·s, and a viscosity of the mixed solvent is 15 mPa·s or less.

Here, each "functional layer" means a light-emitting layer or a functional layer such as a hole injection layer, a hole transport layer, a hole injection/transport layer, an electron injection layer, an electron transport layer, or an electron injection/transport layer.

According to this configuration, the printing method can proceed smoothly without nozzle clogging of a printing device, and solvent that has a low viscosity evaporates quickly due to high vapor pressure, increasing a proportion of solvent that has a high viscosity in a latter half of drying, thereby increasing viscosity and making convection less likely to occur. As a result, occurrence of rising portions can be suppressed, and functional layers can be formed having high flatness.

According to at least one embodiment, the viscosity of the mixed solvent when 80% of the mixed solvent is evaporated is at least 32 mPa·s.

According to this configuration, convection in the ink after printing can be suppressed at a stage of drying that affects film shape, which contributes to uniform film thickness.

According to at least one embodiment, a solvent that has a highest vapor pressure among the solvents has a lowest viscosity among the solvents.

According to this configuration, the solvent that has the lowest viscosity can be quickly evaporated and viscosity can be increased at an early stage of drying of the printed ink.

According to at least one embodiment, the functional material is a low molecular weight material.

A functional material made of low molecular weight material can be purified to a high purity relatively easily, and an organic light-emitting material made of a low molecular weight material excels in color purity.

A manufacturing method according to at least one embodiment is a method of manufacturing a self-luminous element, the method including preparing a substrate, forming a first electrode on or above the substrate, forming a functional layer on or above the first electrode, and forming a second electrode on or above the functional layer. The forming of the functional layer includes a printing process using a functional layer forming ink and a drying process of drying the functional layer forming ink. The functional layer forming ink includes a functional material dissolved or dispersed in a mixed solvent including solvents each having different vapor pressures, a solvent that has a lowest vapor pressure among the solvents having a viscosity of at least 53 mPa·s, and a viscosity of the mixed solvent being 15 mPa·s or less. Here, the functional layer is a light-emitting layer or a charge transfer facilitating layer.

Here, the charge transfer facilitating layer is a layer having a hole injection property, or a hole transport property, or both a hole injection and transport property, or an electron injection property, or an electron transport property, or both a hole injection and transport property.

According to this method, a self-luminous element including a functional layer having high flatness, luminance efficiency, and durability can be provided.

In the present description of the organic EL element, "upper", "top", "above", and "on" do not indicate vertically upwards in any absolute sense, but define relative positions based on a stacking order in a stacked structure of the organic EL element. Specifically, a direction perpendicular to a main surface of the substrate from the substrate through the stacked structure.

Further, in the present description, a content percentage of a solvent in a mixed solvent means percentage by weight (wt %).

1. Functional Layer Forming Ink Compositions
(1) Solute

Solutes for functional layers include high molecular weight materials and low molecular weight materials. Although high molecular weight material has a relatively high viscosity, it also has a molecular weight distribution and drawbacks such as difficulty in purification to achieve high purity, and therefore as a material of an organic EL element, color purity, luminance efficiency, brightness, and the like of emitted color tends to be low.

On the other hand, an organic light-emitting layer using a light-emitting material made of low molecular weight material has a shorter synthesis route than a high molecular weight functional material and is more easily manufactured, and can further be purified to high purity by known techniques such as column chromatography and recrystallization. Thus, use of low molecular weight material in organic EL elements has the advantages of excellent luminance efficiency, high color purity, and vibrant color variations, and has been widely adopted in recent years.

When a solute is a high molecular weight material, ink thickens greatly as solvent evaporates, but when a solute is a low molecular weight material, thickening action of the solute itself is small, and viscosity of the ink tends to depend almost entirely on viscosity of the solvent.

Here, a "low molecular weight" according to at least one embodiment means a molecular weight Mw (weight-average molecular weight) of 3000 or less. The molecular weight Mw of organic material can be measured by using the known methods of low molecular weight gel permeation chromatography (GPC) or liquid chromatography (LC).

(2) Solvent

As described above, when the solute is a high molecular weight material, ink viscosity naturally increases as solvent evaporates, convection is suppressed, and a relatively uniform film thickness can be formed, and therefore the following mainly considers solvent conditions when the solute is a low molecular weight functional material.

<Solvents and Composite Viscosity>

According to at least one embodiment, a solvent of an ink is a mixed solvent obtained by mixing organic solvents having different vapor pressures and viscosities in a defined ratio.

FIG. 1 is a table showing constituent solvents in the mixed solvent examples 1-5 and reference examples 1 and 2, and vapor pressure, viscosity, and mixing ratio in wt % of the constituent solvents.

The solvents of the mixed solvent examples 1-5 are each a mixture of three types of solvent: solvent (II), solvent (IV), and solvent (V), with different mix ratios.

The solvent (II) is 1,5-Pentanediol, having a vapor pressure of 1 Pa and viscosity of 135 mPa·s, the solvent (IV) is benzyl alcohol, having a vapor pressure of 15 Pa and viscosity of 6 mPa·s, and the solvent (V) is 2-Butoxyethanol, having a vapor pressure of 100 Pa and viscosity of 3 mPa·s.

Thus, according to at least one embodiment, the solvent (II) that has the lowest vapor pressure has the highest viscosity, while the solvent (V) that has the highest vapor pressure has the lowest viscosity. A low vapor pressure means that a substance has a high boiling point, while a high vapor pressure means that a substance has a low boiling point.

Accordingly, in a drying process after application from nozzles of a printing device, the mixed solvent examples 1-5, in which the solvent (II), the solvent (VI), and the solvent (V) are mixed in defined ratios, first evaporate in the order of the solvent (V) then the solvent (IV), which have low boiling points and low viscosity, such that in a latter half of the drying process that greatly affects film shape, the solvent (II) that has a high boiling point and high viscosity remains in large proportion, and therefore viscosity of the mixed solvent becomes high.

That is, the mixed solvent composed of the solvent (II), the solvent (IV), and the solvent (V) as described above increases a viscosity thickening rate during drying while also keeping initial viscosity low.

In general terms, viscosity of a two-component mixed solvent composed of a solvent 1 (vapor pressure $p_1$ Pa, viscosity $\eta_1$ mPa·s) and a solvent 2 (vapor pressure $p_2$ Pa, viscosity $\eta_2$ mPa·s) (hereinafter, viscosity of a mixed solvent containing a plurality of solvents is referred to as "composite viscosity") is determined by a calculation illustrated in the table of FIG. 5A.

That is, assuming an evaporation proportion of solvent at the initial stage of drying is "0" (immediately after ejection from nozzles of a printing device), a ratio of the solvent 1 and the solvent 2 is $x_0:y_0$, then the composite viscosity is shown by Expression (1) in a rightmost column of the table in FIG. 5A.

Further, when an evaporation proportion is "$\alpha$", where $0<\alpha\leq1$, a ratio of remaining amounts $x_1$ and $x_2$ of the solvents 1 and 2, respectively, is shown by Expression (2) and Expression (3) in FIG. 5A.

$$x_1 = x_0 - (p_1/(p_1+p_2))\alpha \quad \text{Expression (2)}$$

However, when $x_0-(p_1/(p_1+p_2))\alpha \leq 0$, $x_1=0$.

$$y_1 = y_0 - (p_2/(p_1+p_2))\alpha \quad \text{Expression (3)}$$

However, when $y_0-(p_2/(p_1+p_2))\alpha \leq 0$, $y_1=0$.

Assuming that composite viscosity at this time is $\eta\alpha$, $\eta\alpha$ is represented by Expression (4) in the rightmost column of FIG. 5A.

$$\eta\alpha = \eta_1^{b1} \times \eta_2^{b2} \quad \text{Expression (4)}$$

Where $b1=x_1/(x_1+y_1)$ and $b2=y_1/(x_1+y_1)$.

Assuming the solvent 1 has a low vapor pressure and a high viscosity and the solvent 2 has a high vapor pressure and a low viscosity, $p_1 < p_2$ and $\eta_1 > \eta_2$.

Therefore, a magnitude relation of the right-hand sides (RHS) from Expressions (2) and (3), respectively, is $(p_1/(p_1+p_2))\alpha < (p_2/(p_1+p_2))\alpha$, and a rate of decrease of a fraction $x_1$ of the solvent 1 is less than a rate of decrease of a fraction $y_1$ of the solvent 2.

Therefore, a rate of decrease of b1 and b2 in Expression (4) is also smaller for b1 than for b2. Thus, as an amount of evaporation of the mixed solvent increases, the influence of the solvent 1 having a high viscosity becomes larger than that of the solvent 2 having a low viscosity.

As can be seen from the expressions described above, when a low vapor pressure, high viscosity solvent and a high vapor pressure, low viscosity solvent are mixed, composite viscosity is initially low, but as drying progresses, a residual ratio of the high viscosity solvent becomes dominant in comparison to a residual ratio of the low viscosity solvent, until only the high viscosity solvent remains.

FIG. 5B illustrates composite viscosity of a three component mixed solvent in which a solvent 3 (vapor pressure p3, viscosity $\eta3$) is added as a constituent solvent, and as shown by the two component system of FIG. 5A, composite viscosity at drying initiation (Expression (5)) and composite viscosity during drying (Expression (6)) can be obtained. Further, composite viscosity of a four or more component mixed solvent can be obtained in the same manner.

Returning to the table of FIG. 1, the mixed solvent examples 1-5 have different mixing ratios of the solvent (II), the solvent (IV), and the solvent (V).

Figure 2:
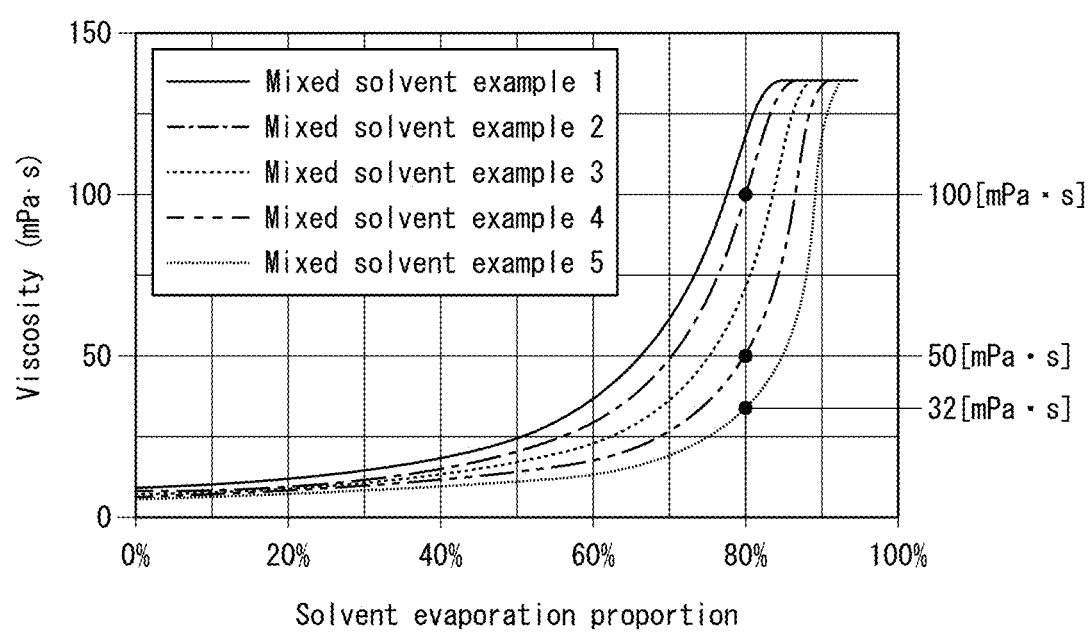
FIG. 2 is a graph illustrating changes in composite viscosity with respect to a solvent evaporation proportion of mixed solvent examples.

FIG. 2 is a graph illustrating a relationship between a solvent evaporation proportion of a mixed solvent and an increase in composite viscosity (also referred to as a "thickening graph") according to the mixed solvent examples 1-5. Vapor pressure and viscosity values for the solvents (II), (IV), and (V), and mixing ratios for the mixed solvent examples 1-5, have been entered into the Expressions (5) and (6) of FIG. 5B.

As shown in FIG. 2, when the solvent evaporation proportion is 0%, the composite viscosity of each of the mixed solvent examples 1-5 is 15 mPa·s or less, which satisfies a condition that ink viscosity does not cause clogging of nozzles of a printing device (also referred to as below as "ejection condition").

In order to suppress generation of satellites (ink drops dividing before reaching a target) and maintain printing accuracy, a lower limit of composite viscosity when the solvent evaporation proportion is 0% is preferably 2 mPa·s, and the mixed solvent examples 1-5 satisfy this condition.

As the solvent evaporation proportion increases due to drying, the high vapor pressure, low viscosity solvents (IV), (V) evaporate faster than the low vapor pressure, high viscosity solvent (II), and therefore the composite viscosity of each mixed solvent increases.

A timing at which viscosity increases rapidly (also referred to below as "thickening timing") varies depending on the mixed solvent, and the thickening timing of the mixed solvent example 1, which has highest concentration of the solvent (II) that has the lowest vapor pressure (1 Pa) and the highest viscosity (135 mPa·s), is earliest, and a steadily lower content of the solvent (II) in the order of the mixed solvent examples 2, 3, 4, 5 corresponds with increasing delay in the thickening timing.

<Film Thickness Evaluation>

Figure 3:
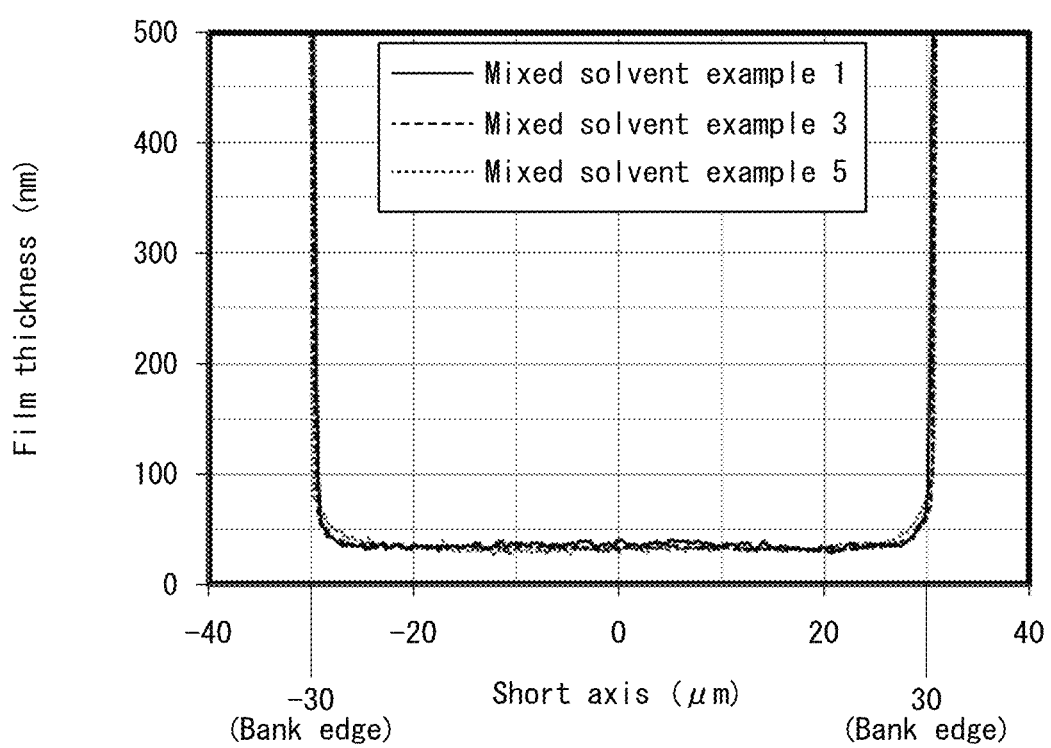
FIG. 3 is a graph illustrating change in film thickness when an organic light-emitting layer is formed using inks prepared with the mixed solvent examples 1, 3, and 5 according to the present disclosure.

FIG. 3 is a graph illustrating the measured results of light-emitting layer film thickness when the mixed solvent examples 1, 3, and 5 were selected from the mixed solvent examples 1-5, a low molecular weight light-emitting material was dissolved in each of them to prepare inks for forming light-emitting layers, and the inks were dropped between bank walls and dried to form light-emitting layers.

The horizontal axis indicates a distance in a short axis direction from a pixel center in micrometer units. In FIG. 3, the width between banks is 60 μm, a center point between the banks is "0" on the horizontal axis, and the banks are substantially orthogonal to the horizontal axis at distances −30 μm and +30 μm. The vertical axis indicates height of a surface of the light-emitting layer from a surface of a layer immediately thereunder, or in other words the film thickness of the light-emitting layer in nanometer units.

As can be seen from the graph, for each mixed solvent example the rising portion is small and the film thickness is substantially uniform.

In order to evaluate film formation shape in more detail, unevenness and flatness were measured near the bank edges.

Figure 4A:
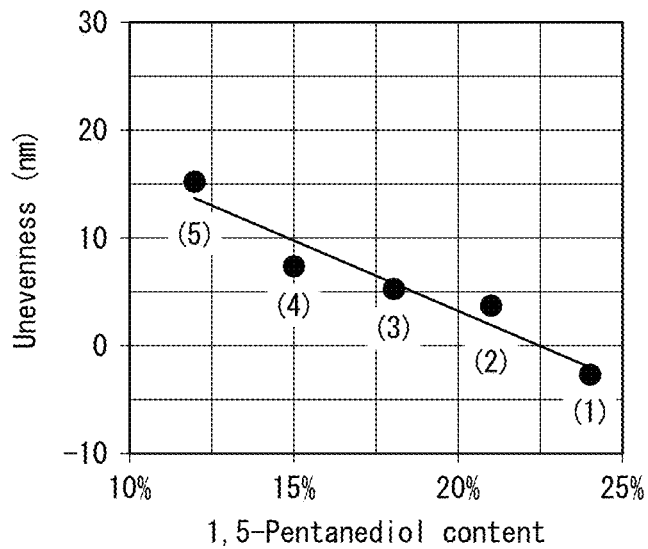
FIG. 4A is a graph illustrating a relationship between percentage of a solvent (II) in a mixed solvent and unevenness of film thickness of a light-emitting layer within 2.5 µm from a bank.

FIG. 4A is a graph illustrating unevenness of film thickness in the organic light-emitting layers formed.

The horizontal axis indicates a percentage content in wt % of the solvent (II), 1,5-Pentanediol (see FIG. 1: vapor pressure 1 Pa, viscosity 135 mPa·s) in the mixed solvent.

The vertical axis indicates unevenness (a difference between film thickness of a central portion and film thickness near a bank) in nanometer units. In the graph, a black circle is a plot of a measured value of unevenness at a position 2.5 μm from the edge of a bank, and if the value of unevenness is positive and large, it means the light-emitting layer has a concave shape, while a negative value indicates a convex shape.

The content of the solvent (II) for each plot from right to left is 24%, 21%, 18%, 15%, 12%, which corresponds exactly to the mixed solvent examples 1, 2, 3, 4, 5 in FIG. 1 (the number (1) to (5) associated to the plots indicate the numbers of the mixed solvent examples 1-5).

As can be seen from FIG. 4A, the smallest absolute value of unevenness at the position 2.5 μm from a bank edge is for mixed solvent example 1, followed by mixed solvent examples 2, 3, 4, 5.

That is, the higher the content of the solvent (II) and the earlier the thickening timing (see FIG. 1, 2), the smaller the unevenness.

Figure 4B:
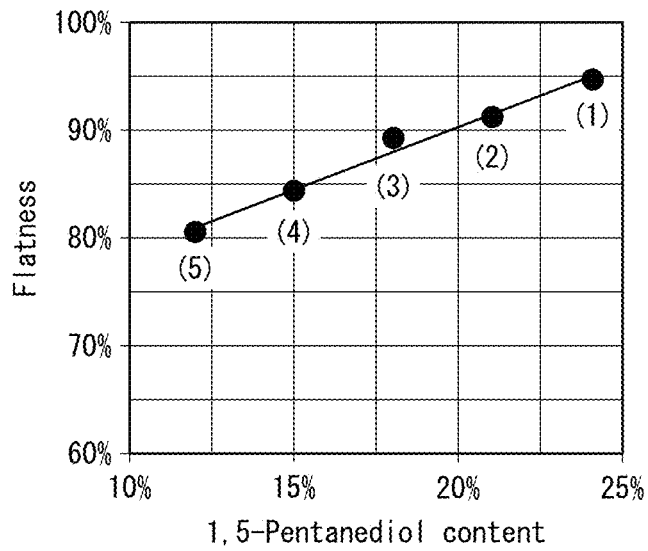
FIG. 4B is a graph illustrating a relationship between percentage of the solvent (II) in the mixed solvent and flatness of the light-emitting layer.

FIG. 4B is a graph illustrating a relationship between solvent (II) content and light-emitting layer flatness.

Here, flatness is a percentage ratio of a first area to a second area, where the first area is an area in plan view where film thickness is in a range of ±10% of a central film thickness, and the second area is an area in plan view of an ideal film shape assuming that all film thickness is uniform and equal to the central film thickness. In order to achieve excellent luminance efficiency, a flatness of 80% or more is desirable.

In FIG. 4B, the horizontal axis indicates a percentage content of the solvent (II) in the mixed solvent, and the vertical axis indicates flatness. In FIG. 4B, the plots of the black circles correspond from right to left to the mixed solvent examples 1, 2, 3, 4, 5, as in FIG. 4A.

As is clear from FIG. 4B, the flatness of mixed solvent example 1 containing the largest amount of the solvent (II) reached 95%, and even mixed solvent example 5 containing the smallest amount of the solvent (II) exceeded 80%.

As illustrated by the graph of FIG. 2, the thickening timing becomes delayed as the solvent (II) content decreases. When thickening timing is delayed, the time during which convection occurs becomes longer, and the rising portion is correspondingly more likely to form.

In particular, according to the findings of the inventor, when the solvent evaporation proportion is 80%, the height of ink during drying falls below the height of the banks, and subsequently, formation of rising portions tends to be promoted. Thus, it can be said that at the latest, viscosity of the mixed solvent should be thickened to a constant viscosity by the time the solvent evaporation proportion is 80%.

Thus, focusing on mixed solvent example 5, which has the latest thickening timing among the five mixed solvent examples, in FIG. 4B, flatness of a film formed by ink including the mixed solvent example 5 (12% 1,5-Pentanediol) is approximately 80%, and in FIG. 2, when the solvent evaporation proportion is 80%, viscosity is 32 mPa·s.

Accordingly, viscosity being 32 mPa·s or more when the solvent evaporation proportion is 80% is one condition for film flatness to be 80% or more. This is because even if a solvent having a low vapor pressure and high viscosity is included in a mixed solvent, if the thickening timing is delayed by too much, the formation of a rising portion cannot be sufficiently suppressed.

Further, in the case of the mixed solvent example 4 (15% 1,5-Pentanediol), in FIG. 4B, flatness is approximately 85%, and in FIG. 2, when the solvent evaporation proportion is 80%, viscosity is approximately 50 mPa·s. Further, in the case of the mixed solvent example 2 (21% 1,5-Pentanediol), in FIG. 4B, flatness exceeds 90%, and in FIG. 2, when the solvent evaporation proportion is 80%, viscosity is approximately 100 mPa·s.

Therefore, when considering higher definition displays, it is desirable to have a viscosity of 50 mPa·s or more when the solvent evaporation proportion of a mixed solvent is 80%, and even more desirable to have a viscosity of 100 mPa·s or more when the solvent evaporation proportion of a mixed solvent is 80%.

Reference Example

The following describes reference examples 1 and 2 from the table of FIG. 1.

(1) Reference Example 1

As shown in the table of FIG. 1, reference example 1 substitutes a solvent (III), Hexylene Glycol (vapor pressure 8 Pa, viscosity 38 mPa·s) for the solvent (II), which has the lowest vapor pressure among the constituent solvents in the mixed solvent examples 1-5. The mixing ratios of the solvent (III), the solvent (IV), and the solvent (V) are 20%, 30%, and 50%, respectively.

Viscosity of the solvent (III) that has the lowest vapor pressure is 38 Pa, which is less than one-third of the viscosity of the solvent (II) included in the mixed solvent examples 1-5.

Figure 6:
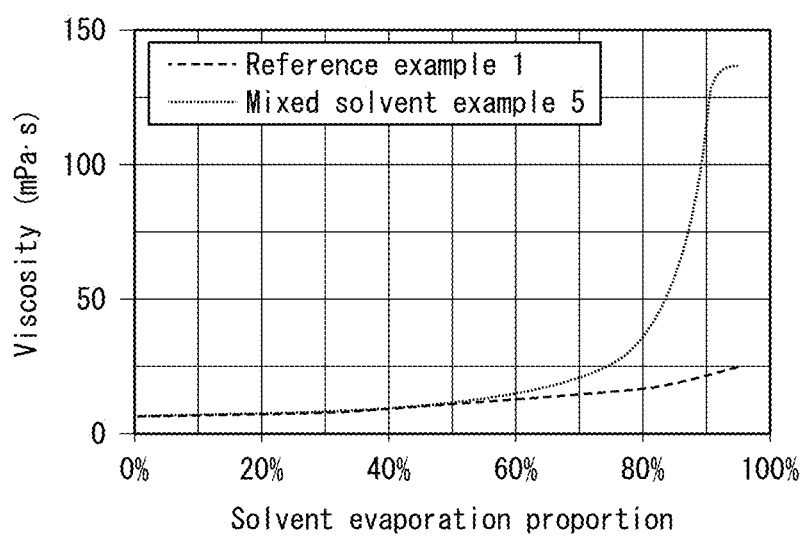
FIG. 6 is a graph illustrating a comparison of changes in composite viscosity with respect to a solvent evaporation proportion between mixed solvent example 5 and reference example 1 as shown in FIG. 1.

A graph of thickening of the reference example 1 is shown by a dashed line in FIG. 6, where there is no point of "thickening timing", and even when solvent evaporation proportion is almost 95%, viscosity doesn't even reach 30 mPa·s.

Figure 7:
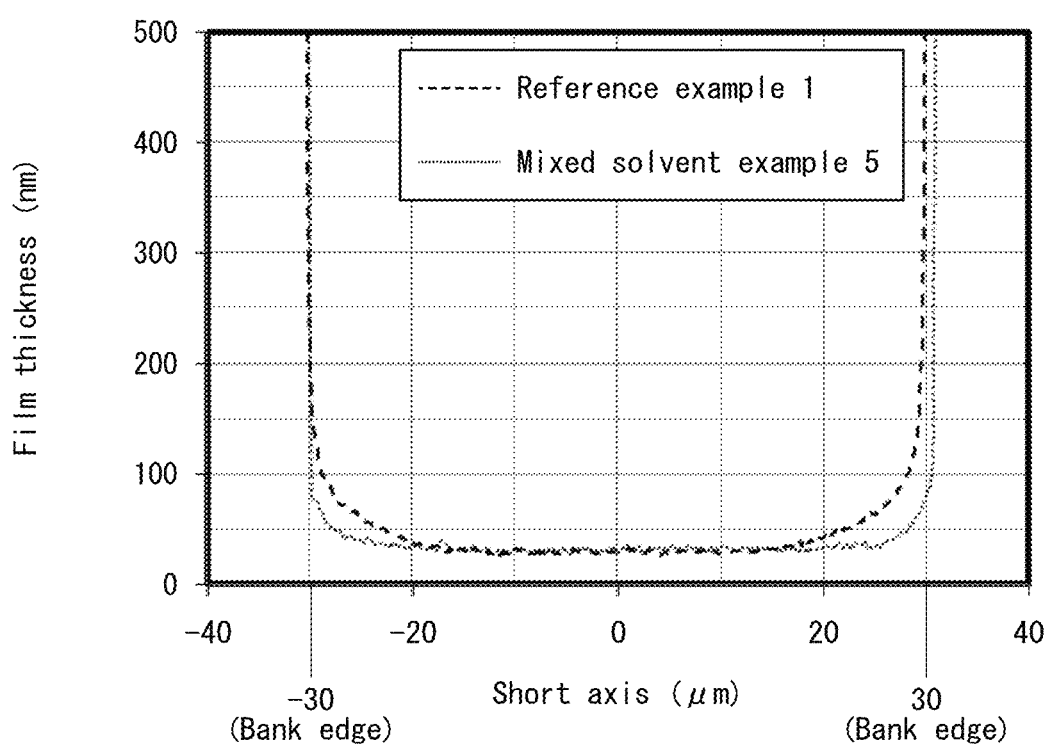
FIG. 7 is a graph illustrating a comparison of changes in film thickness when an organic light-emitting layer is formed using inks made using mixed solvent example 5 and reference example 1 as shown in FIG. 1.

When an ink is prepared with the mixed solvent of reference example 1 to form an organic light-emitting layer, the resulting film shape, as shown by the bold dashed line in FIG. 7, has a much larger rising portion than that of the mixed solvent example 5, shown by a dotted line, and flatness drops to about 50%.

(2) Reference Example 2

The following is a description of reference example 2 of a mixed solvent.

Figure 8:
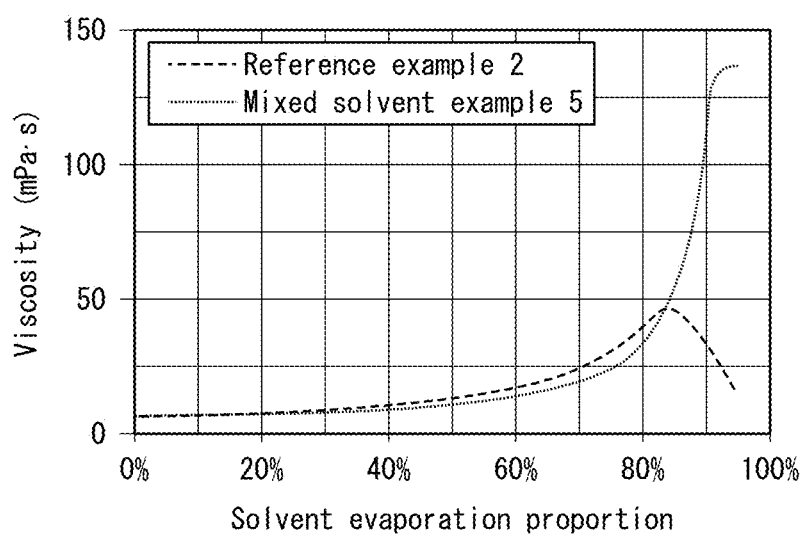
FIG. 8 is a graph illustrating a comparison of changes in composite viscosity with respect to a solvent evaporation proportion between mixed solvent example 5 and reference example 2 as shown in FIG. 1.

As shown in the table of FIG. 1, reference example adds a fourth solvent (I), Tetraethylene Glycol Dimethyl Ether, to the solvents (II), (IV), (V) that are constituent solvents in the mixed solvent examples 1-5. The added solvent (I) has the lowest vapor pressure among the constituent solvents (0.1 Pa), and viscosity is only 4 mPa·s, and therefore during drying, viscosity greatly decreases after a temporary increase, as shown by the bold dashed line in the graph of FIG. 8.

That is, according to reference example 2, when the solvent evaporation proportion exceeds 60%, the thickening rate increases due to the influence of the solvent (II), but the solvent (II) evaporates faster than the solvent (I), and therefore when the solvent evaporation proportion exceeds 85%, the viscosity of the solvent (I) suddenly becomes dominant, and viscosity falls below 30 mPa·s.

Figure 9:
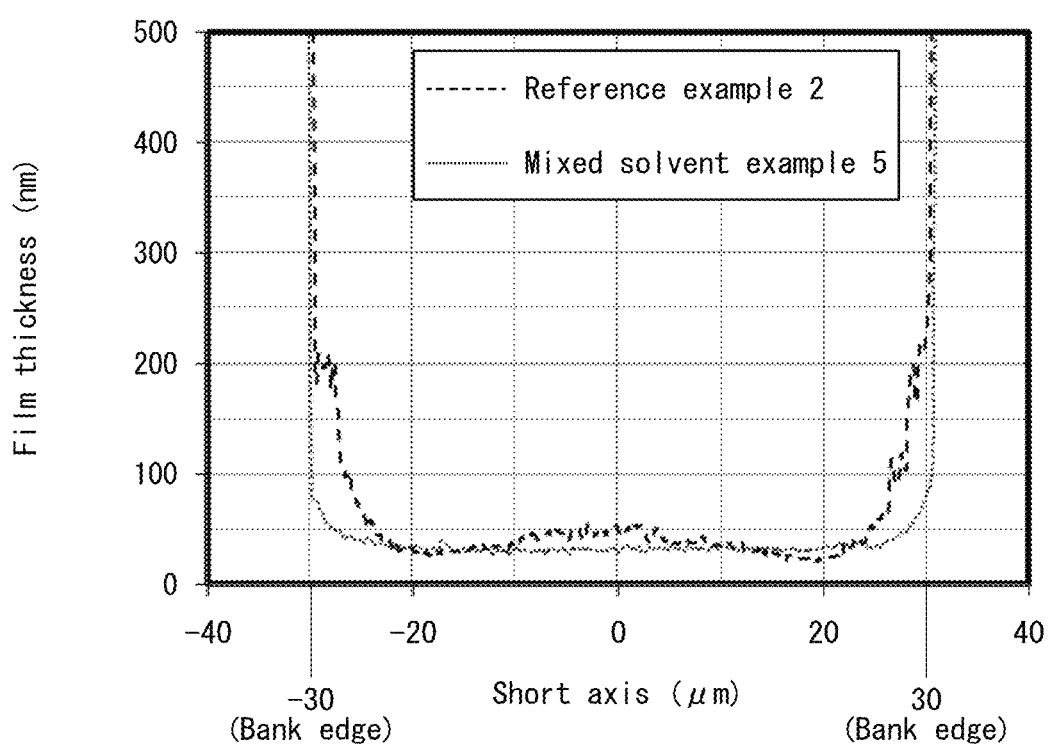
FIG. 9 is a graph illustrating a comparison of changes in film thickness when an organic light-emitting layer is formed using inks made using mixed solvent example 5 and reference example 2 as shown in FIG. 1.

Thus, according to reference example 2, the thickening rate increases during drying, but in the final stages viscosity drops significantly, and therefore, as shown by the bold dashed line in FIG. 9, the rising portion is large, and the film shape is convex with a slight central bulge and a flatness far below 80%.

According to reference example 2, even while including substantially the same constituent solvent as mixed solvent example 5, adding just a small amount of the solvent (I) that has the lowest vapor pressure and very low viscosity has a very large effect on film formation shape.

<Minimum Vapor Pressure Solvent Viscosity Conditions>

From the above, it is apparent that in order to obtain a film shape having a flatness of 80% or more, it is necessary that viscosity of the solvent in the mixed solvent having the lowest vapor pressure (also referred to as "minimum vapor pressure solvent viscosity") be at least a defined constant.

For example, in the case of a two-component mixed solvent, the types and mixing ratio of the two constituent solvents can be obtained by the following process, based on the viscosity expression in FIG. 5A.

Here, solvent 1 has a vapor pressure $p_1$ Pa, and a viscosity $\eta_1$ mPa·s, solvent 2 has a vapor pressure $p_2$ Pa, and a viscosity $\eta_2$ mPa·s, where $p_1 < p_2$, $\eta_1 > \eta_2$, and an initial mixing ratio is $x_0 : y_0$.

Candidates for the solvent 1 are listed up from a selection of solvents, the vapor pressure $p_1$ and the viscosity $\eta_1$ for each, and the vapor pressure $p_2$ and the viscosity $\eta_2$ for each of the solvents 2 that satisfy the following condition 1 and condition 2 when entered into the Expressions (1) through (4) in FIG. 5A, are entered in the Expressions (1) through (4), and whether or not an appropriate mixing ratio ($x_0 : y_0$) exists for each combination is thereby determined.

Condition 1: initial (mixed solvent evaporation proportion is 0%) composite viscosity is 15 mPa·s or less (ejection condition).

Condition 2: viscosity when mixed solvent evaporation proportion is 80% ($\alpha = 0.8$) is 32 mPa·s or more (thickening timing condition).

An ink was prepared with a mixed solvent consisting of solvents 1 and 2 satisfying the above conditions to form an organic light-emitting layer, and whether or not flatness was 80% or more was confirmed.

FIG. 10 is a list of solvents that can be used as solvent 1, selected by repeating the experiments described above. The solvent having the lowest viscosity in this list is 1,3-propanediol, with a viscosity of 53 mPa·s.

Accordingly, if viscosity of the solvent having the lowest vapor pressure among constituent solvents of a mixed solvent is at least 53 mPa·s, the conditions 1 and 2 can be satisfied by combining with a suitable solvent having a high vapor pressure and low viscosity, thereby making it possible to form a film with a flatness of 80% or more. The same is true for a mixed solvent including three or more components.

If the viscosity of the solvent that has the lowest vapor pressure is 53 mPa·s, then the viscosity at a final stage of drying can be secured, which is important when forming a film shape. If this condition is satisfied, then when the mixed solvent includes three or more components, then viscosity of the solvent having the second lowest vapor pressure may even be slightly higher than viscosity of the solvent having the lowest vapor pressure. This is because it is the solvent with the lowest vapor pressure that remains until the end, and the viscosity of this solvent is the most important.

Accordingly, among the solvent included in the mixed solvent, the viscosity of the solvent having the lowest vapor pressure should be at least 53 mPa·s, but this does not always have to be the highest viscosity among the constituent solvents.

2. Organic EL Element Structure

The following describes an organic EL element, an organic EL panel, and an organic EL display device according to at least one embodiment, with reference to the drawings. The drawings may be schematic, and are not necessarily to scale.

(1) Overall Structure of Organic EL Display Device 1

Figure 11:
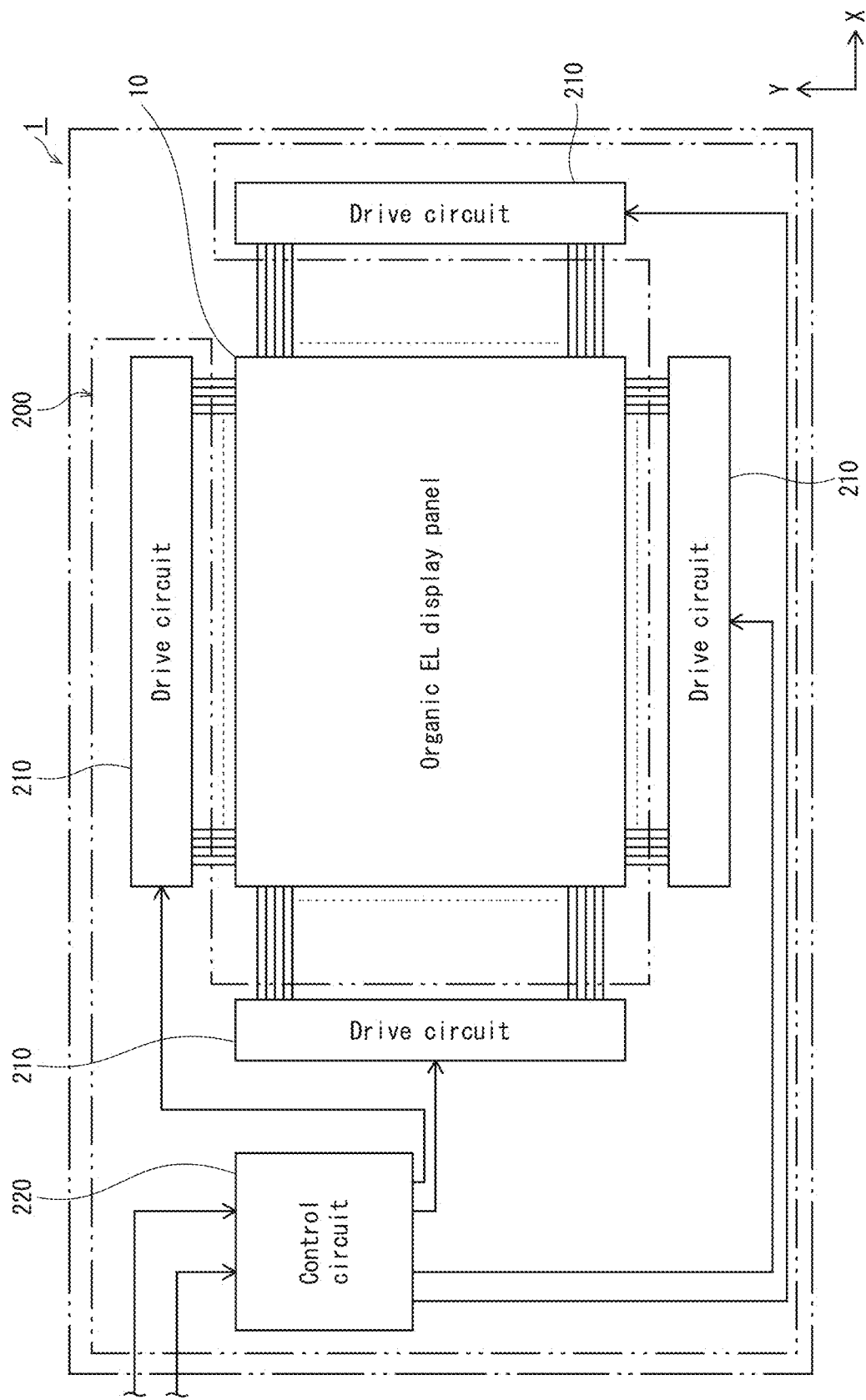
FIG. 11 is a block diagram illustrating an overall structure of an organic EL display device according to at least one embodiment.

FIG. 11 is a block diagram illustrating an overall structure of an organic EL display device 1. The organic EL display device 1 is used as a display unit of a television, a personal computer, a mobile terminal, or other electronic device.

The organic EL display device 1 includes an organic EL panel 10 and a drive controller 200 electrically connected thereto. The organic EL panel 10 according to at least one embodiment is a top-emission display panel in which a plurality of organic EL elements (not illustrated) are arranged along an image display surface, and an image is displayed by combining light emission of the organic EL elements. As an example, the organic EL panel 10 employs an active matrix system.

The drive controller 200 includes drive circuits 210 connected to the organic EL panel 10 and a control circuit 220 connected to an external device such as a computer or a signal receiver such as a television tuner. The drive circuits 210 include a power supply circuit supplying electric power to each organic EL element, a signal circuit for applying a voltage signal for controlling the electric power supplied to each organic EL element, a scanning circuit for switching a position to which the voltage signal is applied at regular intervals, and the like. The control circuit 220 controls operations of the drive circuits 210 according to data including image information input from the external device or the signal receiver.

(2) Structure of Organic EL Panel 10

(A) Plan View Structure

Figure 12:
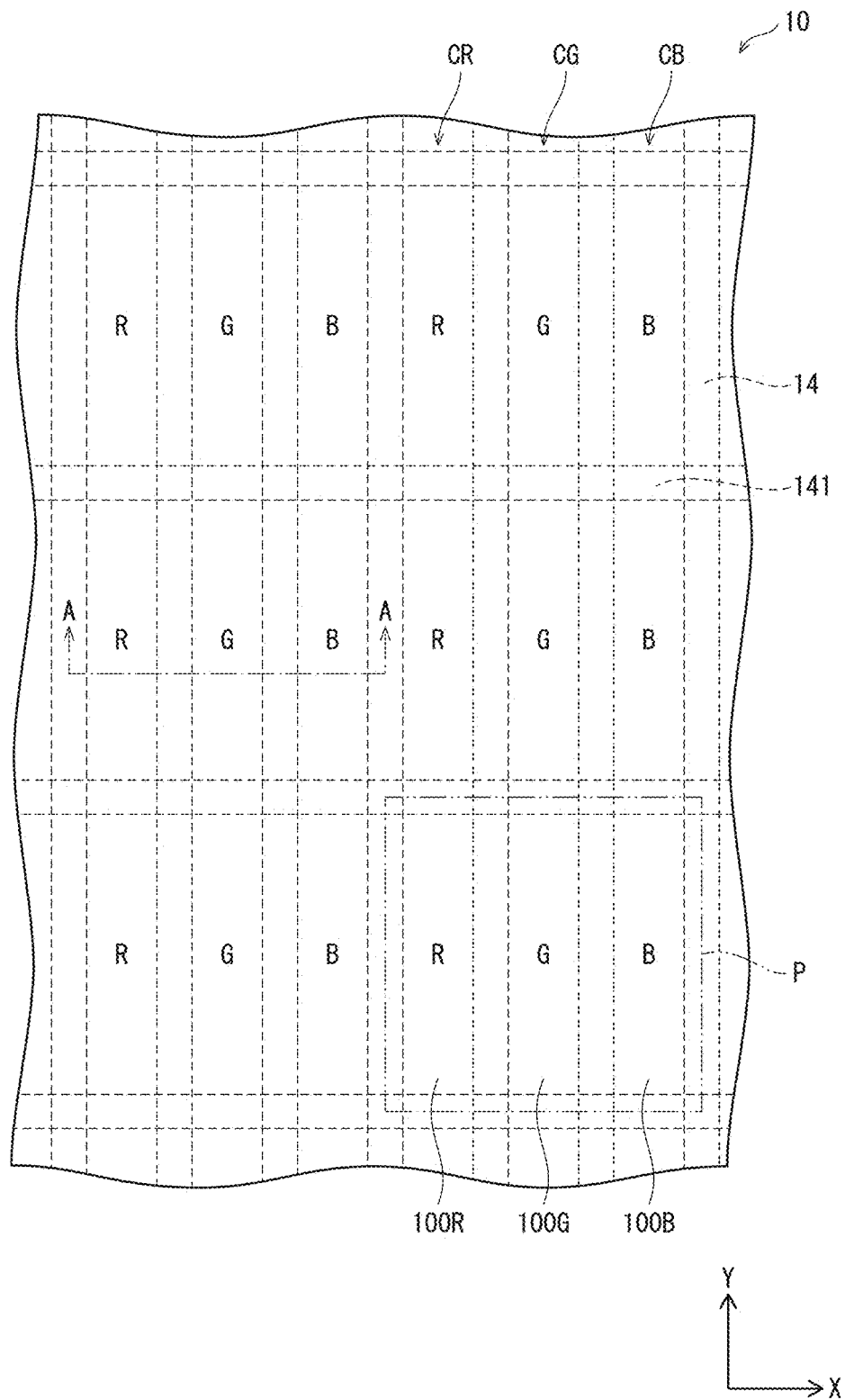
FIG. 12 is a schematic plan view diagram enlargement of a portion of an image display surface of an organic EL panel of the organic EL display device.

FIG. 12 is a schematic plan view enlargement of a portion of an image display face of the organic EL panel 10. According to the organic EL panel 10, as an example, sub-pixels 100R, 100G, 100B are arranged in a matrix and emit red, green, and blue (also referred to as R, G, and B) colors of light, respectively. The sub-pixels 100R, 100G, 100B are lined up alternating in the X direction, and a set of the sub-pixels 100R, 100G, 100B in the X direction constitute one pixel P. In one pixel P, full color can be expressed by combining controlled emission luminance of the sub-pixels 100R, 100G, 100B.

In addition, in the Y direction, the sub-pixels 100R, the sub-pixels 100G, and the sub-pixels 100B are arranged to form sub-pixel columns CR, sub-pixel columns CG, and sub-pixel columns CB, respectively, in which only the corresponding color of sub-pixel is present. As a result, across the organic EL panel 10, the pixels P are arranged in a matrix along the X direction and the Y direction, and an image is displayed on the image display face through a combination of colors of light emitted by the pixels P.

Organic EL elements 2(R), 2(G), 2(B) (see FIG. 13) that emit R, G, B colors of light correspond to the sub-pixels 100R, 100G, 100B, respectively.

The organic EL panel 10 according to at least one embodiment employs a line bank structure. That is, the sub-pixel columns CR, CG, CB are partitioned by banks 14 at intervals in the X direction, and in each of the sub-pixel columns CR, CG, CB, the sub-pixels 100R, 100G, or 100B therein share a continuous organic light-emitting layer.

However, in each of the sub-pixel columns CR, CG, CB, pixel regulation layers 141 are disposed at intervals in the Y direction to insulate the sub-pixels 100R, 100G, 100B from each other, such that each of the sub-pixels 100R, 100G, 100B can emit light independently.

(B) Cross-Section Structure

Figure 13:
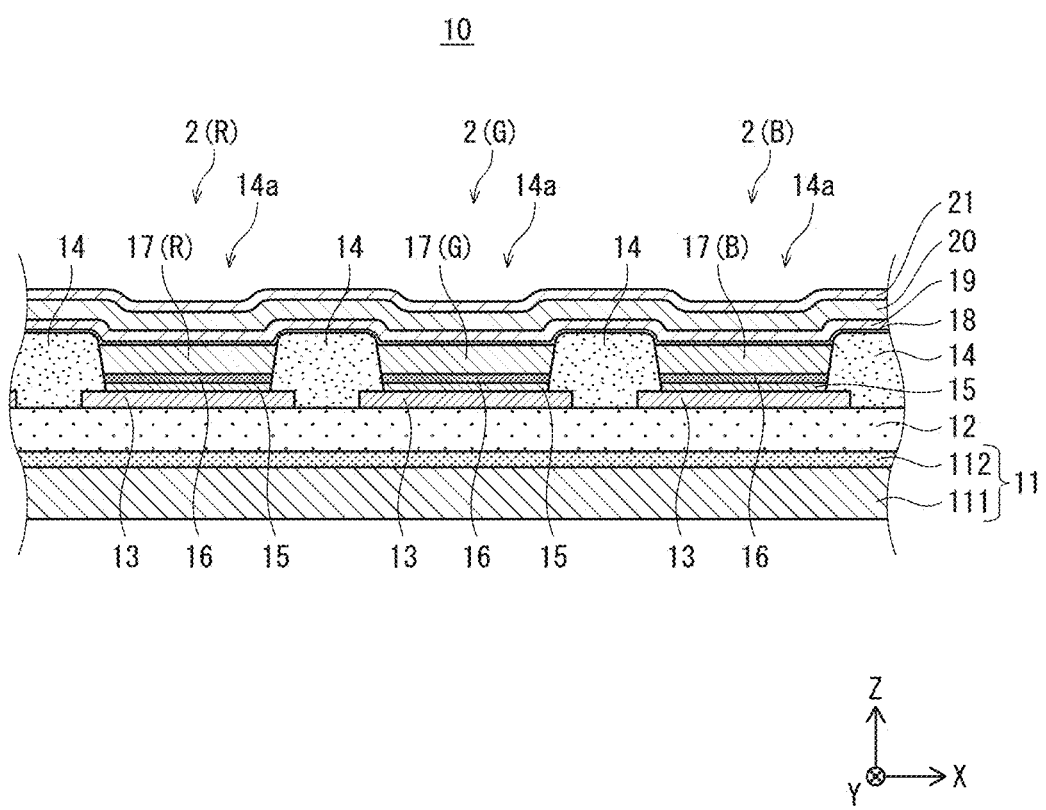
FIG. 13 is a schematic cross-section diagram of a cross-section along a line A-A of FIG. 12.

FIG. 13 is a schematic cross-section diagram of a cross-section along a line A-A of FIG. 12. In the organic EL panel 10, one pixel is composed of three sub-pixels that emit R, G, B colors of light, respectively, and each sub-pixel includes a corresponding one of the organic EL elements 2(R), 2(G), 2(B). The organic EL elements 2(R), 2(G), 2(B) each have essentially almost the same structure, and therefore are each described as an organic EL element 2 when not distinguished from each other.

As illustrated in FIG. 13, the organic EL elements 2 includes the substrate 11, an interlayer insulating layer 12, pixel electrodes (anodes) 13, the banks 14, hole injection layers 15, hole transport layers 16, organic light-emitting layers 17, an electron transport layer 18, an electron injection layer 19, a counter electrode (cathode) 20, and a sealing layer 21.

The substrate 11, the interlayer insulating layer 12, the electron transport layer 18, the electron injection layer 19, the counter electrode 20, and the sealing layer 21 do not correspond one-to-one to pixels, but are common to a plurality of the organic EL elements 2 in the organic EL panel 10.

<Substrate>

The substrate 11 includes a base 111 that is an insulative material, and a thin film transistor (TFT) layer 112. A drive circuit for each sub-pixel is formed in the TFT layer 112. According to at least one embodiment, the base 111 is a glass substrate, a quartz substrate, a silicon substrate, a metal substrate where the metal may be molybdenum sulfide, copper, zinc, aluminum, stainless steel, magnesium, iron, nickel, gold, silver, or the like, a semiconductor substrate where the semiconductor is gallium arsenide or the like, a plastic substrate, or the like.

Examples of a plastic material of the plastic substrate include a thermoplastic resin and a thermosetting resin. Examples include polyethylene, polypropylene, polyamide, polyimide (PI), polycarbonate, acrylic resin, polyethylene terephthalate (PET), polybutylene terephthalate, polyacetal, other fluororesins, various thermoplastic elastomers such as styrene-based, polyolefin-based, polyvinyl chloride-based, polyurethane-based, fluororubber-based, or chlorinated polyethylene-based elastomers, epoxy resin, unsaturated polyester, silicone resin, polyurethane, or the like, or a copolymer, blend, polymer alloy, or the like that is mainly composed of at least one of the above, or a laminated body in which one or two or more of the above are stacked.

According to at least one embodiment, the organic EL display panel is flexible, and the substrate is a plastic material.

<Interlayer Insulating Layer>

The interlayer insulating layer 12 is disposed on the substrate 11. The interlayer insulating layer 12 is made of a resin material, and planarizes unevenness of an upper surface of the TFT layer 112. An example of the resin material is a positive type photosensitive material. Examples of such photosensitive material include acrylic resin, polyimide resin, siloxane resin, and phenolic resin. Although not illustrated in the cross section diagram of FIG. 13, for each sub-pixel a contact hole is formed in the interlayer insulating layer 12.

<Pixel Electrodes (First Electrode)>

The pixel electrodes 13 each include a metal layer of a metal material that is light-reflective, and are disposed on the interlayer insulating layer 12. The pixel electrodes 13 correspond one-to-one with the sub-pixels, and are electrically connected to the TFT layer 112 via the contact holes (not illustrated). According to at least one embodiment, the pixel electrodes 13 function as anodes.

Examples of the metal material that is light-reflective include silver (Ag), aluminum (Al), aluminum alloy, molybdenum (Mo), silver palladium copper alloy (APC), silver rubidium gold alloy (ARA), and the like. According to at least one embodiment, each of the pixel electrodes 13 is a single metal layer. According to at least one embodiment, each of the pixel electrodes 13 is a stacked structure of a layer made of a metal oxide such as indium tin oxide (ITO) or indium zinc oxide (IZO) on the metal layer.

<Banks and Pixel Regulation Layers>

The banks 14 partition the pixel electrodes 13 corresponding to the sub-pixels on the substrate 11 into columns in the X direction (see FIG. 12), and each has a line bank shape extending in the Y direction between the sub-pixel columns CR, CG, CB in the X direction. An electrically insulative material is used for the banks 14. Examples of an electrically insulative material are insulative organic materials such as acrylic resin, polyimide resin, novolac resin, phenolic resin, or the like.

The banks 14 function as structures for preventing ink of different colors from overflowing and mixing when forming the light-emitting layers 17 by an application method. When using a resin material, a photosensitive material is preferable from the viewpoint of processability. According to at least one embodiment, the banks 14 have organic solvent and heat resistance. In order to suppress overflow of ink, according to at least one embodiment, surfaces of the banks 14 have a defined liquid repellency.

The pixel regulation layers 141 are made of an electrically insulating material and cover end portions in the Y direction of the pixel electrodes 13 in each sub-pixel column, partitioning the pixel electrodes 13 in the Y direction. The pixel regulation layers 141 have roles such as suppressing interruption of the organic light-emitting layers 17 in each of the sub-pixel columns CR, CG, CB, and improving electrical insulation between the pixel electrodes 13 and the counter electrode 20.

Film thickness of the pixel regulation layers 141 is set so that a top surface thereof is lower than a top surface of the organic light-emitting layers 17 in an ink state, but higher than a top surface of the organic light-emitting layers 17 after drying. As a result, the organic light-emitting layers 17 in an ink state in each of the sub-pixel columns CR, CG, CB are not partitioned by the pixel regulation layers 141, and flow of ink when forming the organic light-emitting layers 17 is not hindered by the pixel regulation layers 141. Thus, uniform film thickness is facilitated for each of the organic light-emitting layers 17 in the sub-pixel columns.

<Hole Injection Layers>

The hole injection layers 15 are disposed on the pixel electrodes 13 to promote injection of holes from the pixel electrodes 13 to the light-emitting layers 17. The hole injection layers 15 are each, for example, made of an oxide such as silver (Ag), molybdenum (Mo), chromium (Cr), vanadium (V), tungsten (W), nickel (Ni), or iridium (Ir), or a low molecular weight organic compound such as copper phthalocyanine (CuPc), or a high molecular weight material such as polyethylene dioxythiophene polystyrene sulfonate (PEDOT:PSS).

<Hole Transport Layers>

The hole transport layers 16 have a function of transporting holes injected from the hole injection layers 15 to the organic light-emitting layers 17. The hole transport layers 16 are formed by a wet process such as a printing method using an ink in which an arylamine derivative, a fluorene derivative, a spiro derivative, a carbazole derivative, a pyridine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, or a metal complex is dissolved in a mixed solvent, or even a high molecular weight compound such as a polymer is dissolved into a low molecular weight compound such as a monomer in a mixed solvent.

<Organic Light-Emitting Layers>

The organic light-emitting layers 17 are disposed in the openings 14a, and have a function of emitting light in RGB colors through recombination of holes and electrons. Where a distinction is made between light emission colors, the organic light-emitting layers 17 may be referred to as organic light-emitting layers 17(R), 17(G), 17(B).

Examples of organic light-emitting materials used in the organic light-emitting layers 17 include a fluorescent substance such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, a metal complex of oxine, a rare earth metal complex, or the like, or a phosphorescent substance such as a metal complex that emits phosphorescence such as tris(2-phenylpyridine).

According to at least one embodiment, the organic light-emitting layers 17 are formed by using polyfluorene, a polyfluorene derivative, polyphenylene, a polyphenylene derivative, a high molecular weight compound such as polyarylamine or a polyarylamine derivative, or a mixture of one or more of the low molecular weight compounds and one or more of the high molecular weight compounds listed above.

<Electron Transport Layer>

The electron transport layer 18 has a function of transporting electrons from the counter electrode 20 to the light-emitting layers 17. According to at least one embodiment, the electron transport layer 18 is a π-electron low molecular weight organic material such as an oxadiazole derivative (OXD), a triazole derivative (TAZ), a phenanthroline derivative (BCP, Bphen), or the like.

<Electron Injection Layer>

The electron transport layer 19 has a function of injecting electrons supplied from the counter electrode 20 towards the light-emitting layers 17. The electron injection layer 19 is made of an organic material having high electron transportability, doped with a metal selected from alkali metals or alkaline earth metals such as lithium (Li), sodium (Na), potassium (K), calcium (Ca), or barium (Ba).

An example of the organic material of the electron injection layer 19 is a π-electron low molecular weight organic material such as an oxadiazole derivative (OXD), a triazole derivative (TAZ), a phenanthroline derivative (BCP, Bphen), or the like.

<Counter Electrode (Second Electrode)>

The counter electrode 20 is made of a light-transmissive electrically conductive material and is disposed on the electron injection layer 19. The counter electrode 20 functions as a cathode.

Examples of a material of the counter electrode 20 include metals such as silver, silver alloy, aluminum, aluminum alloy, or the like. According to at least one embodiment, the counter electrode 20 is light-transmissive, and therefore has a film thickness from 10 nm to 50 nm.

<Sealing Layer>

The sealing layer 21 is provided to prevent organic layers such as the hole transport layers 16, the light-emitting layers 17, the electron transport layer 18, the electron injection layer 19, and the like from deteriorating due to exposure to external moisture or air.

The sealing layer 21 includes a light-transmissive material such as silicon nitride (SiN), silicon oxynitride (SiON), or the like.

<Other Structure>

Although not illustrated in FIG. 13, according to at least one embodiment, an antiglare polarizing plate or an upper substrate is attached to the sealing layer 21 via a light-transmissive adhesive. Further, according to at least one embodiment, a color filter is attached for correcting chromaticity of light emitted by each of the organic EL elements 2. As a result, the hole transport layers 16, the organic light-emitting layers 17, the electron injection layer 19, and the like are further protected from external moisture and air.

3. Organic EL Element Manufacturing Method

Figure 14:
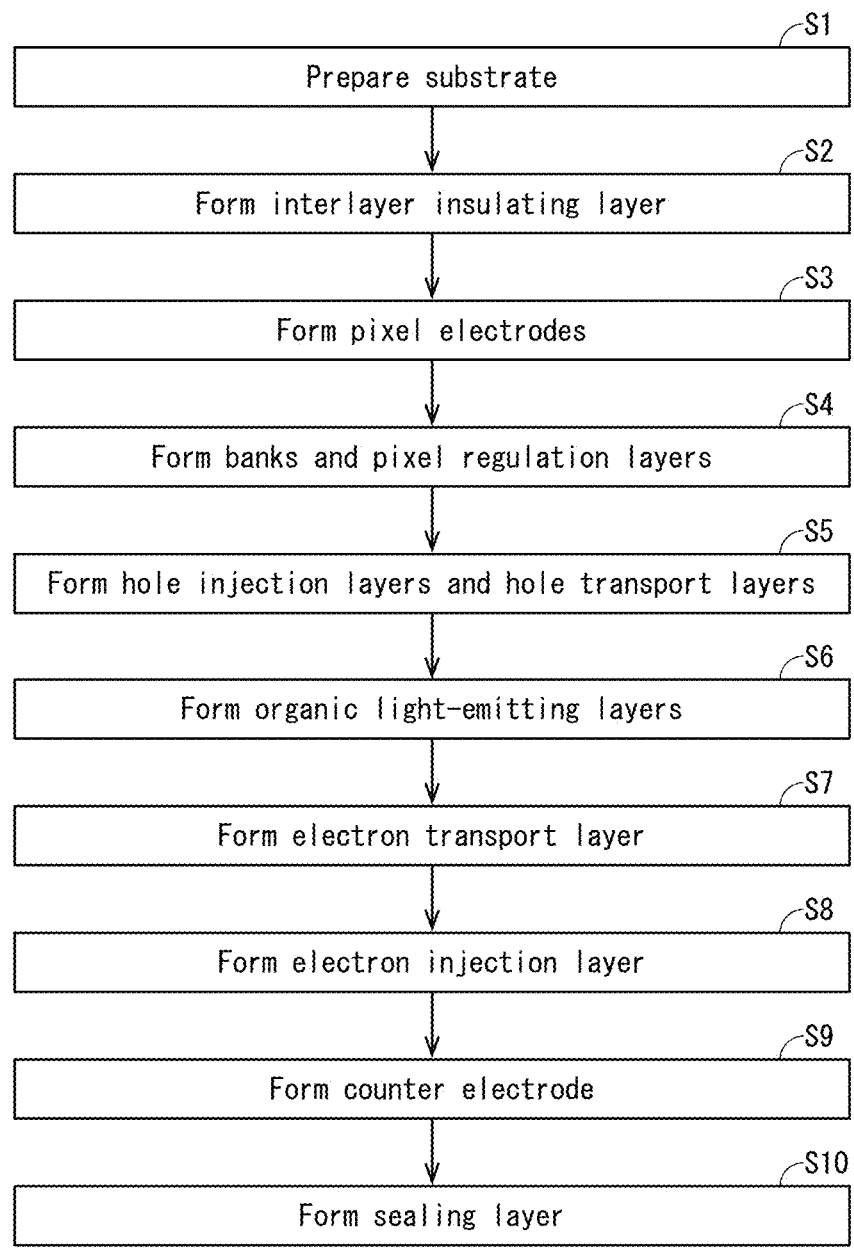
FIG. 14 is a flowchart illustrating an organic EL element manufacturing process according to at least one embodiment.

The following describes a top-emission type of organic EL element using the functional layer forming ink according to at least one embodiment, an organic EL panel using the organic EL element, and method of manufacturing same, with reference to drawings from FIG. 14 to FIG. 18D. FIG. 14 is a flowchart illustrating a process of manufacturing the organic EL elements 2, and the drawings from FIG. 15A to FIG. 18D are cross-section diagrams schematically illustrating the process of manufacturing the organic EL elements 2. The drawings may be schematic, and are not necessarily to scale.

(1) Preparing Substrate

Figure 15A:
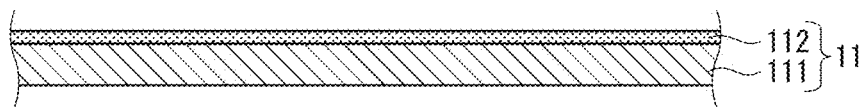
FIG. 15A, 15B, 15C, 15D are cross-section diagrams schematically illustrating a portion of the organic EL element manufacturing process.

First, as illustrated in FIG. 15A, the TFT layer 112 is formed on the base 111 to prepare the substrate 11 (step S1 in FIG. 14). The TFT layer 112 can be formed by a known TFT manufacturing method.

(2) Interlayer Insulating Layer Formation

Figure 15B:
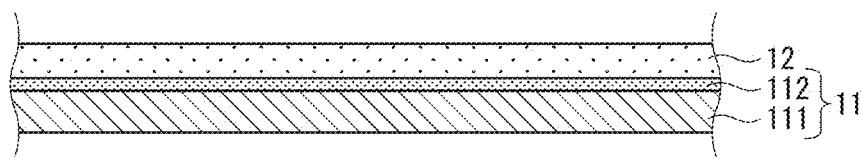

Next, as illustrated in FIG. 15B, the interlayer insulating layer 12 is formed on the substrate 11 (step S2 in FIG. 14).

Specifically, a resin material having a defined fluidity is applied across the top surface of the substrate 11 by, for example, a die coating method, so as to fill irregularities in the top surface of the substrate 11 due to the TFT layer 112. Thus, the top surface of the interlayer insulating layer 12 has a flattened shape conforming to the top surface of the base 111.

Further, a dry etching method is applied to a portion of the interlayer insulating layer 12 above TFT elements, for example source electrodes, to form contact holes (not illustrated), and connecting electrode layers are formed along inner walls of the contact holes. According to at least one embodiment, the connecting electrode layers are formed by using a sputtering method to form a metal film, after which patterning is performed by using a photolithography method or wet etching method.

(3) Pixel Electrode Formation

Figure 15C:
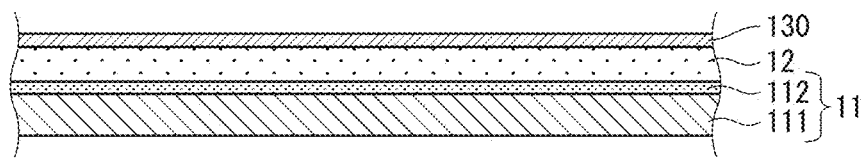
Figure 15D:
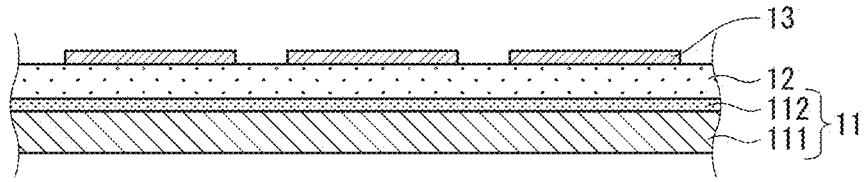

Next, as illustrated in FIG. 15C, a pixel electrode material layer 130 is formed on the interlayer insulating layer 12. According to at least one embodiment, the pixel electrode material layer 130 is formed by using a vacuum deposition method or sputtering method. As illustrated in FIG. 15D, the pixel electrode material layer 130 is patterned by etching to form the pixel electrodes 13 corresponding one-to-one with sub-pixels (step S3 in FIG. 14).

(4) Banks and Pixel Regulation Layers Formation

Next, the banks 14 and the pixel regulation layers 141 are formed (step S4 in FIG. 14).

According to at least one embodiment, the pixel regulation layers 141 and the banks 14 are formed in separate processes.

(4-1) Pixel Regulation Layers Formation

First, the pixel regulation layers 141 extending in the X direction are formed in order to partition pixel electrode columns in the Y direction of FIG. 12 at sub-pixel intervals.

Figure 16A:
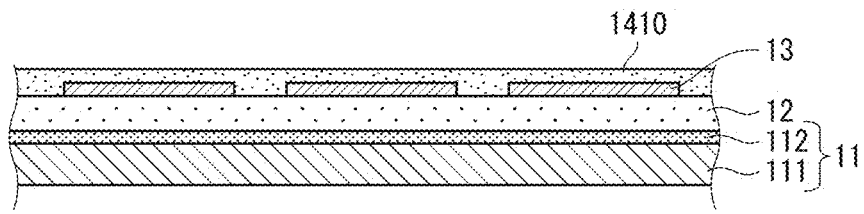
FIG. 16A, 16B, 16C, 16D are cross-section diagrams schematically illustrating a portion of the organic EL element manufacturing process continuing from FIG. 15D.

As illustrated in FIG. 16A, a photosensitive resin material to be a material of the pixel regulation layers 141 is uniformly applied on the interlayer insulating layer 12 on which the pixel electrodes 13 are formed, thereby forming a pixel regulation layer material layer 1410. An amount of resin material applied at this time is determined in advance in order to obtain a target film thickness of the pixel regulation layers 141 after drying.

Specific examples of application methods include wet processes such as a die coating method, a slit coating method, a spin coating method, and the like. After application, according to at least one embodiment, vacuum drying and low-temperature heat drying at about 60° C. to 120° C. is performed to remove unnecessary solvent and to fix the pixel regulating layer material layer 1410 to the interlayer insulating layer 12.

Next, a photolithography method is used to pattern the pixel regulation layer material layer 1410. According to at least one embodiment, the pixel regulation layer material layer 1410 has positive photosensitivity, a portion intended to remain as the pixel regulation layers 141 is shielded from light, and a portion to be removed is exposed through light-transmissive openings of a photomask (not illustrated).

Next, the pixel regulation layers 141 can be formed by developing and removing exposed regions of the pixel regulation layer material layer 1410. As a specific developing method, an example is to immerse the substrate 11 in a developing solution such as an organic solvent or alkaline solution that dissolves portions of the pixel regulation layer material layer 1410 that have been exposed to light, then immerse the substrate 11 in a rinsing liquid such as pure water to wash the substrate 11.

Figure 16B:
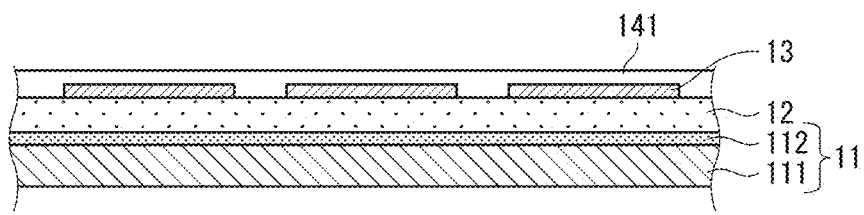

Subsequently, baking at a defined temperature (post-baking) forms the pixel regulation layers 141 on the interlayer insulating layer 12, extending in the X direction (FIG. 16B).

(4-2) Bank Formation

Next, the banks 14 extending in the Y direction are formed in a similar way to the pixel regulation layers 141.

Figure 16C:
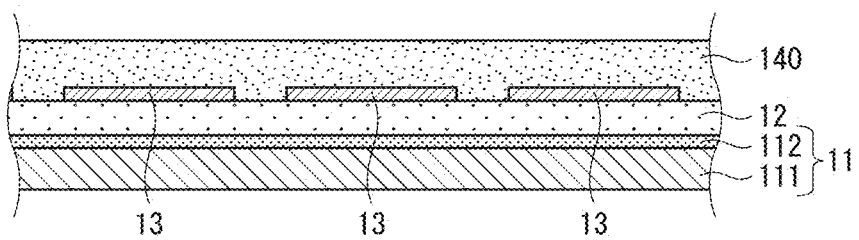
Figure 16D:
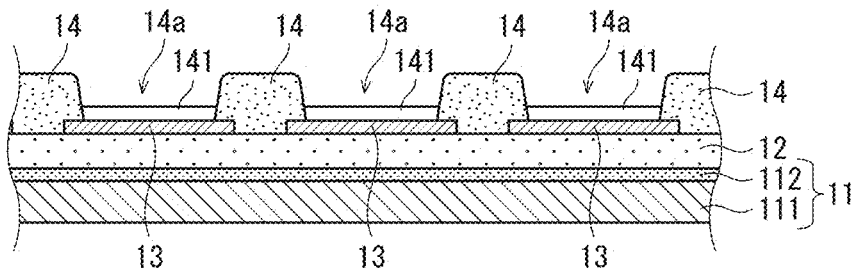

That is, a bank resin material is applied by a die coating method or the like on the interlayer insulating layer 12 on which both the pixel electrodes 13 and the pixel regulation layers 141 are formed, thereby forming a bank material layer 140 (FIG. 16C). An amount of resin material applied at this time is determined in advance in order to obtain a target height of the banks 14 after drying. Subsequently, a photolithography method is used to pattern the bank material layer 140 into the banks 14 that extend in the Y direction, then drying at a defined temperature forms the banks 14 (FIG. 16D).

As described above, according to at least one embodiment, the pixel regulation layers 141 and the banks 14 are each formed by a wet process then patterned. However, according to at least one embodiment, the pixel regulation layers 141, the banks 14, or both the pixel regulation layers 141 and the banks 14 are formed by a dry process and patterned by a photolithography method and an etching method.

(5) Hole Injection Layers and Hole Transport Layers Formation.

Next, the hole injection layers 15 and the hole transport layers 16 are formed (step S5 in FIG. 14).

First, the hole injection layers 15 are formed by an ink in which a low molecular weight material that has a hole injection property as described above is dissolved or dispersed in a mixed solvent such as the mixed solvent example 1. The ink is ejected from nozzles 3011 of an application head 301 of a printing device into the openings 14a, then the mixed solvent is volatilized and/or baked to form the hole injection layers 15.

The hole transport layers 16 are formed by an ink in which a low molecular weight material that has a hole transport property as described above is dissolved or dispersed in a mixed solvent such as the mixed solvent example 1. The hole transport layers 16 are formed on the hole injection layers 15 by the same printing method as the hole injection layers 15.

Figure 17A:
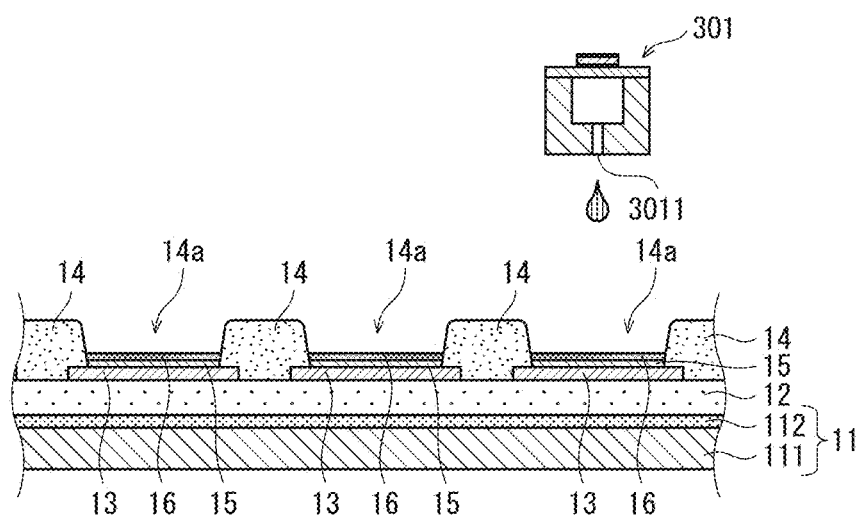
FIG. 17A, 17B are cross-section diagrams schematically illustrating a portion of the organic EL element manufacturing process continuing from FIG. 16D.

FIG. 17A illustrates a schematic cross-section diagram of the display panel 10 when the hole transport layers 16 are formed after the hole injection layers 15 are formed.

(6) Organic Light-Emitting Layer Formation

Next, the organic light emitting layers 17 are formed on the hole transport layers 16 (step S6 in FIG. 14).

Figure 17B:
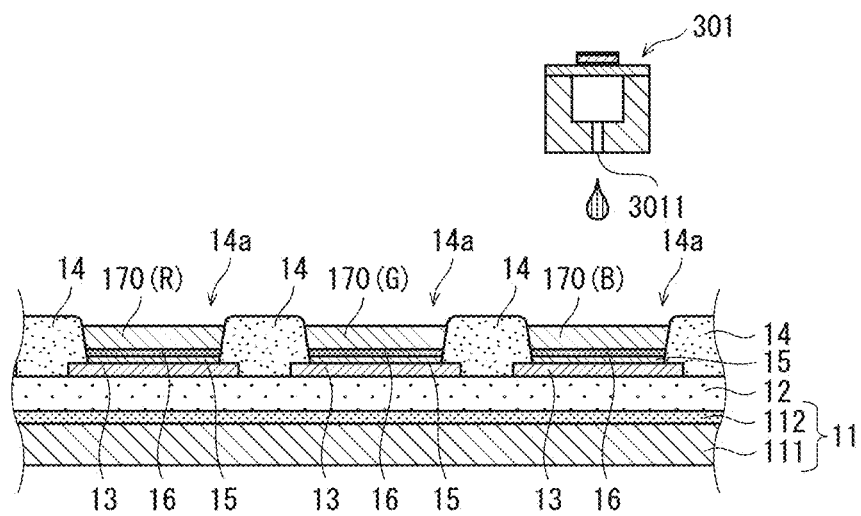

Specifically, according to at least one embodiment, inks are used in which low molecular weight organic light-emitting materials selected from the light-emitting materials described above that are constituent materials of organic light-emitting layers that emit colors of light corresponding to sub-pixels of the openings 14a are dissolved in a mixed solvent such as the mixed solvent example 1. The inks are applied onto the hole transport layers 16 by sequential ejection from the nozzles 3011 of the application head 301 of the printing device, as illustrated in FIG. 17B. After application, the substrate 11 is carried into a vacuum drying chamber and heated in a vacuum environment to evaporate the organic solvents in the ink, and form the organic light-emitting layers 17.

(7) Electron Transport Layer Formation

Figure 18A:
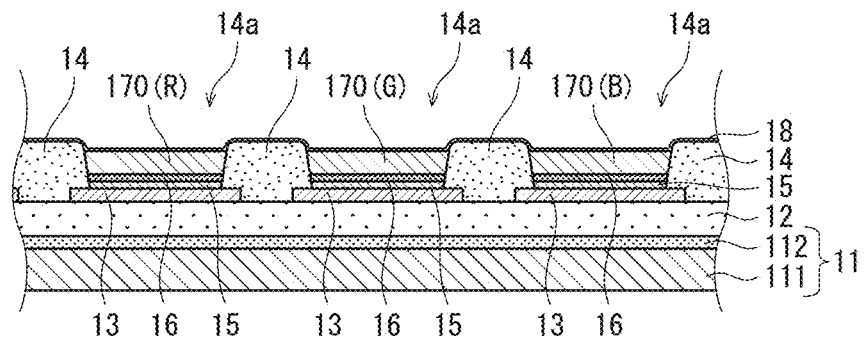

Next, as illustrated in FIG. 18A, an ink is used in which a low molecular weight material that has an electron transport property is dissolved in a mixed solvent such as the mixed solvent example 1. The ink is ejected from the nozzles 3011 of the application head 301 of the printing device onto the organic light-emitting layers 17 in the openings 14a, and onto the banks 14, then the organic solvents in the ink are evaporated to form the electron transport layer 18 (step S7 in FIG. 14).

(8) Electron Injection Layer Formation

Figure 18B:
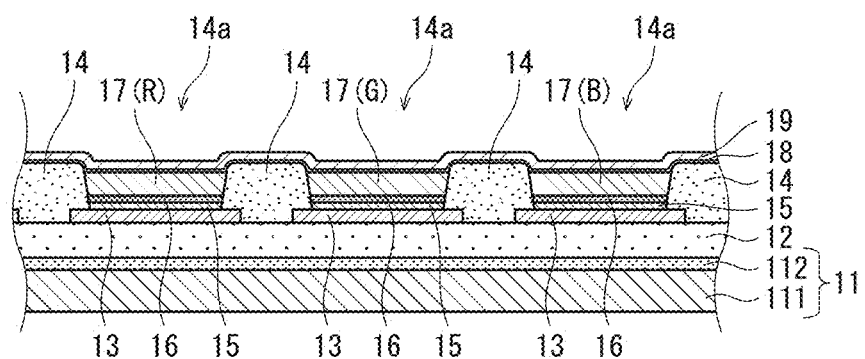

Subsequently, as illustrated in FIG. 18B, a material that has an electron injection property is deposited by vacuum deposition onto the electron transport layer 18 to form the electron injection layer 19 (step S8 in FIG. 14).

(9) Counter Electrode Formation

Figure 18C:
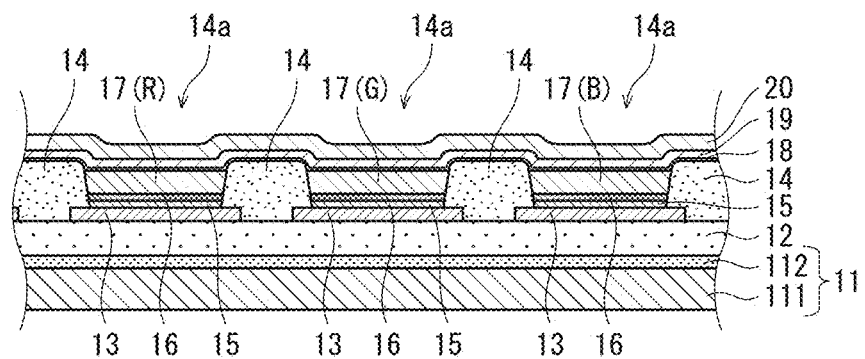

Next, the counter electrode 20 is formed on the electron injection layer 19 (step S9 in FIG. 14). A film of silver, aluminium, or the like is formed on the electron injection layer 19 by a sputtering method or a vacuum deposition method (FIG. 18C).

(10) Sealing Layer Formation

Figure 18D:
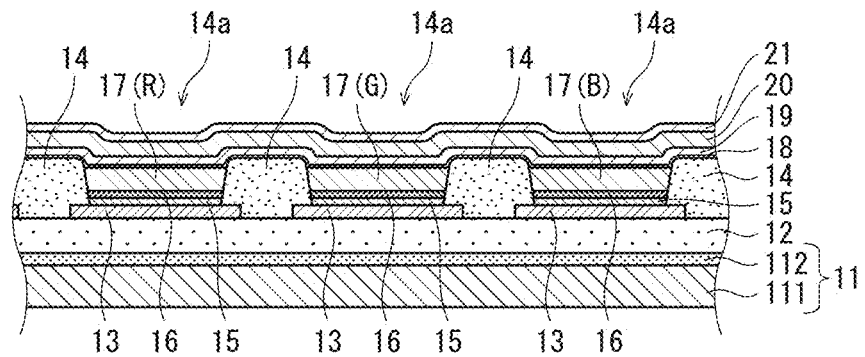

Next, as illustrated in FIG. 18D, the sealing layer 21 is formed on the counter electrode 20 (step S10 in FIG. 14). The sealing layer 21 is a film of SiON, SiN, or the like formed by a sputtering method, a chemical vapor deposition (CVD) method, or the like.

The display panel 10 illustrated in FIG. 13 is manufactured as described above. The manufacturing method described above is merely an example and can be appropriately changed according to purpose.

Modifications

The organic EL element 2 according to various embodiments is described above, but the present disclosure is not limited to the above embodiments except in terms of essential characterizing features. Various modifications of each embodiment conceivable by a person having ordinary skill in the art, and any combination of elements and functions of each embodiment and modification thereof that does not depart from the spirit of the present invention are also included in the present disclosure. The following describes modifications of the organic EL element and organic EL display panel as examples of further embodiments.

(1) According to at least one embodiment, viscosity of a solvent having the highest vapor pressure among constituent solvents of a mixed solvent is set to be lowest, but this is not always necessary. However, in order to make the thickening timing as early as possible while satisfying the ejection condition, viscosity of a solvent having the highest vapor pressure is preferably set to be lowest.

(2) According to at least one embodiment, a low molecular weight material is used as a solute, but a high molecular weight material may be used as a solute as long as initial ink viscosity satisfies the ejection condition. A solute of a high molecular weight material automatically thickens due to solvent evaporation, and therefore an ink having an earlier thickening timing can be provided by dissolving or dispersing a high molecular weight material therein, which can further suppress convection during drying and further improve flatness of a functional layer.

(3) As long as at least one functional layer is formed by a printing method that uses an ink of a functional material dissolved or dispersed in a mixed solvent according to the present disclosure, where "functional layer" means a hole injection layer, hole transport layer, or hole injection/transport layer that facilitates movement of holes from an anode, or an electron injection layer, electron transport layer, or electron injection/transport layer that facilitates movement of electrons from a cathode (also referred to as "charge transfer facilitating layer"), or an organic light-emitting layer, then remaining functional layers may be formed by a dry process such as a vacuum deposition method.

By forming at least one layer among the functional layers, in particular the organic light-emitting layers, using the mixed solvent according to the present disclosure, flatness of the at least one layer can be improved in order to provide an organic EL element having excellent luminance efficiency and durability.

(4) According to at least one embodiment, the cathode is the counter electrode, and the organic EL element is a top-emission type of element. However, the anode may be a counter electrode and the cathode may be a pixel electrode. Further, for example, the organic EL element may be a bottom-emission type of element.

(5) Further, according to at least one embodiment, each of the organic EL elements 2 includes the electron transport layer 18, the electron injection layer 19, one of the hole injection layers 15, and one of the hole transport layers 16, but structure is not limited to this example. For example, the organic EL elements need not include the electron transport layer 18, or the organic EL elements need not include the hole transport layers 16. Further, for example, instead of the hole injection layers 15 and the hole transport layer 16, hole injection/transport layers may be provided.

(6) As long as ink can be applied via nozzles with high definition, a printing device according to the embodiments described above need not be used, and a dispenser type of coating device that continuously ejects ink onto a substrate may be used.

(7) According to at least one embodiment, a line bank type of organic EL display panel is described in which banks are formed in columns, but the organic EL display panel may be a pixel bank type in which a grid of banks are formed that surround each sub-pixel.

(8) According to at least one embodiment, an organic EL display panel using organic EL elements as self-luminous elements is described, but the present disclosure can also be applied to display panels such as quantum dot display panels using quantum dot light-emitting diodes (QLED) (for example, see JP 2010-199067), as only light-emitting layer structure and type are different, and structure such as the light-emitting layers being disposed between the pixel electrodes and the counter electrode are the same.

SUPPLEMENT

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

The invention claimed is:

1. An ink used in forming a functional layer of a self-luminous element by a printing method, the ink comprising:
    a functional material; and
    a mixed solvent including solvents each having different vapor pressures, wherein
    the functional material is dissolved or dispersed in the mixed solvent,
    a solvent that has a lowest vapor pressure among the solvents has a viscosity of at least 53 mPa·s, and
    a viscosity of the mixed solvent is 15 mPa·s or less.

2. The ink of claim 1, wherein
    the viscosity when 80% of the mixed solvent is evaporated is at least 32 mPa·s.

3. The ink of claim 1, wherein
    a solvent that has a highest vapor pressure among the solvents has a lowest viscosity among the solvents.

4. The ink of claim 1, wherein
    the functional material is a low molecular weight material.

5. A method of manufacturing a self-luminous element, the method comprising:

preparing a substrate;

forming a first electrode on or above the substrate;

forming a functional layer on or above the first electrode; and forming a second electrode on or above the functional layer, wherein the forming of the functional layer includes a printing process using a functional layer forming ink and a drying process of drying the functional layer forming ink, and the functional layer forming ink includes a functional material dissolved or dispersed in a mixed solvent including solvents each having different vapor pressures, a solvent that has a lowest vapor pressure among the solvents having a viscosity of at least 53 mPa·s, and a viscosity of the mixed solvent being 15 mPa·s or less.

6. The method of claim 5, wherein the functional layer is a light-emitting layer or a charge transfer facilitating layer.

7. The method of claim 6, wherein the charge transfer facilitating layer is a layer having a hole injection property, or a hole transport property or both a hole injection and transport property, or an electron injection property, or an electron transport property, or both an electron injection and transport property.

* * * * *